United States Patent
Lee et al.

(10) Patent No.: US 7,728,898 B2
(45) Date of Patent: Jun. 1, 2010

(54) SEMICONDUCTOR DEVICE HAVING TEMPORARY SIGNAL STORAGE UNIT

(75) Inventors: Yun-hee Lee, Yongin-si (KR); Kang-bok Lee, Suwon-si (KR); Seok-ha Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 526 days.

(21) Appl. No.: 11/714,842

(22) Filed: Mar. 7, 2007

(65) Prior Publication Data
US 2007/0215970 A1    Sep. 20, 2007

(30) Foreign Application Priority Data
Mar. 17, 2006    (KR) .................. 10-2006-0025023

(51) Int. Cl.
*H04N 3/14* (2006.01)
*H04N 5/335* (2006.01)

(52) U.S. Cl. ........................ 348/308; 257/239
(58) Field of Classification Search ................ 348/294, 348/302, 308; 257/239, 431
See application file for complete search history.

(56) References Cited

U.S. PATENT DOCUMENTS

| | | | |
|---|---|---|---|
| 5,016,108 A | 5/1991 | Akimoto et al. | |
| 6,674,470 B1 * | 1/2004 | Tanaka et al. | 348/302 |
| 7,408,578 B2 * | 8/2008 | Chapman et al. | 348/308 |
| 2004/0218078 A1 | 11/2004 | Lee | |
| 2005/0139769 A1 | 6/2005 | Kita et al. | |
| 2006/0108614 A1 * | 5/2006 | Yi et al. | 257/239 |
| 2007/0080413 A1 * | 4/2007 | Kwak | 257/431 |

FOREIGN PATENT DOCUMENTS

| | | |
|---|---|---|
| JP | 2005-175104 | 6/2005 |
| JP | 2005-175392 | 6/2005 |
| JP | 2006-049744 | 2/2006 |
| KR | 10-2001-0057856 | 7/2001 |
| KR | 10-2004-0093947 | 11/2004 |
| KR | 10-2006-0058391 | 5/2006 |

* cited by examiner

*Primary Examiner*—Gevell Selby
(74) *Attorney, Agent, or Firm*—Lee & Morse, P.C.

(57) ABSTRACT

A semiconductor device having a unit capable of temporarily storing electrical signals, may include an electrical signal generation unit, a first signal transmission unit electrically connected to the electrical signal generation unit, a first signal storage unit electrically connected to the first signal transmission unit, a second signal transmission unit electrically connected to the first signal storage unit, a second signal storage unit electrically connected to the second signal transmission unit, a reset unit electrically connected to the second signal storage unit, an amplification unit electrically connected to the second signal storage unit, a selection unit electrically connected to the amplification unit, and an output unit electrically connected to the selection unit, for stable signal processing.

17 Claims, 13 Drawing Sheets

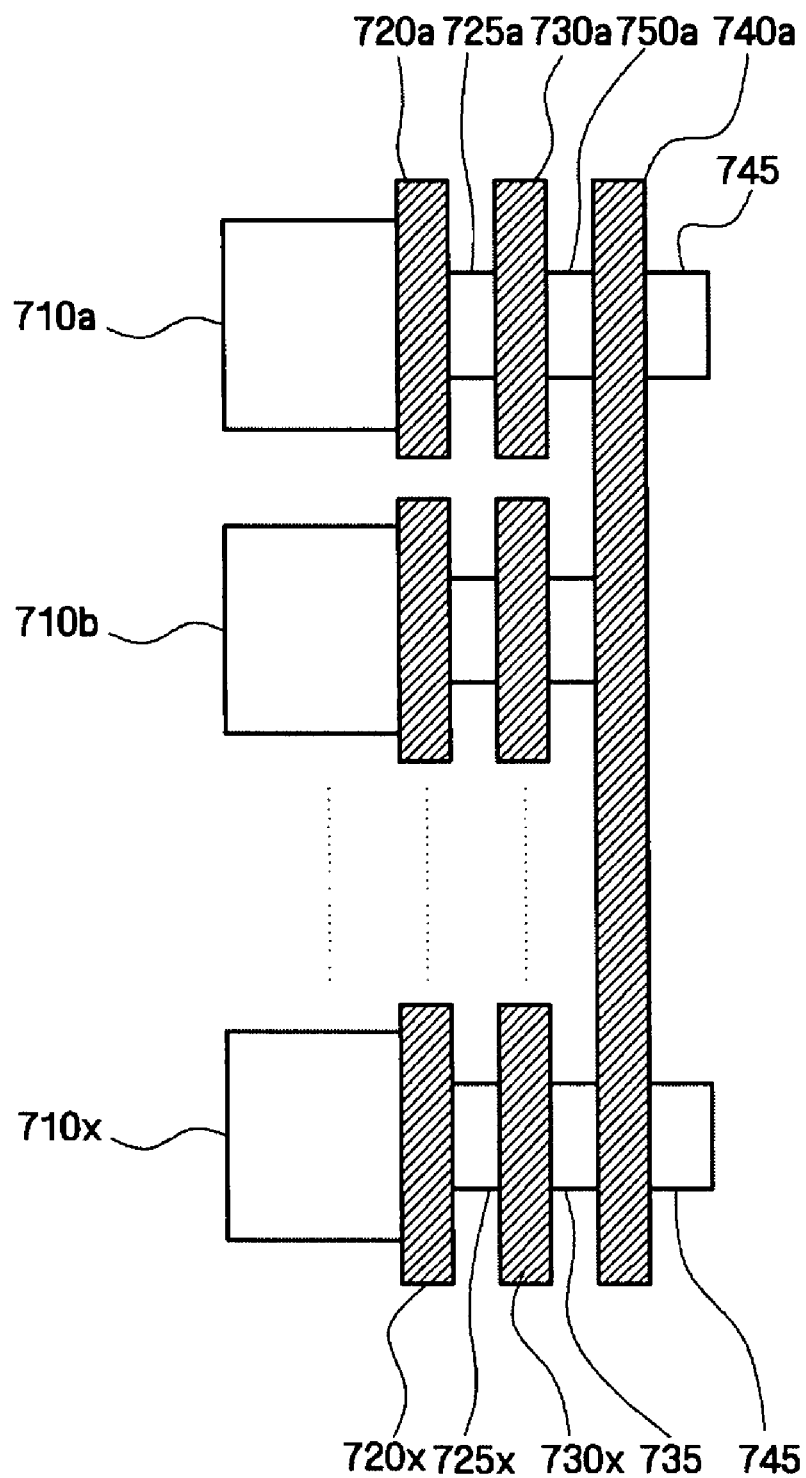

SEMICONDUCTOR DEVICE HAVING TEMPORARY SIGNAL STORAGE UNIT

BACKGROUND OF THE INVENTION

1. Field of the Invention

A semiconductor device has a signal storage unit capable of temporarily storing electrical signals, more particularly, a semiconductor device has a temporary signal storage unit in which electrical signals are not distorted.

2. Description of the Related Art

Stable electrical signal processing is very important for semiconductor devices having electrical signal generation units. Even though the electrical signal generation unit may operate in a digital manner, it is difficult not to consider signal loss, excessive amplification, interference between signals, signal transmission delay, or the like when processing generated electrical signals. Also, if a semiconductor device operates in an analog manner, very precise control is required from the point in time at which electrical signals are generated to the point in time at which the final output signals are obtained by performing processes, e.g., amplification, transmission, and reset, for the electrical signals.

For example, a semiconductor device, such as a CMOS image sensor, has an electrical signal generation unit that continuously generates electrical signals in response to received light. In this case, when the electrical signals are processed, the electrical signals are often distorted due to the subsequent generation of electrical signals. As a result, abnormal images may be obtained. The signal distortion described above may be overcome by using a sequential signal processing method. However, problems may occur when implementing a method in which all signals are simultaneously processed.

SUMMARY OF THE INVENTION

The present invention is therefore directed to a semiconductor device which substantially overcomes one or more of the problems due to the limitations and disadvantages of the related art.

It is therefore a feature of an embodiment of the present invention to provide a semiconductor device, more particularly a CMOS image sensor, which is capable of stably and sequentially processing signals, as well as a method of simultaneously processing signals.

At least one of the above and other features and advantages of the present invention may be realized by providing a semiconductor device that may include an electrical signal generation unit, a first signal transmission unit electrically connected to the electrical signal generation unit, a first signal storage unit electrically connected to the first signal transmission unit, a second signal transmission unit electrically connected to the first signal storage unit, a second signal storage unit electrically connected to the second signal transmission unit, a reset unit electrically connected to the second signal storage unit, an amplification unit electrically connected to the second signal storage unit, a selection unit electrically connected to the amplification unit, and an output unit electrically connected to the selection unit.

The first signal transmission unit may include a transistor having a first electrode electrically connected to the electrical signal generation unit and a second electrode electrically connected to the first signal storage unit. The second signal transmission unit may include a transistor having a first electrode electrically connected to the first signal storage unit and a second electrode electrically connected to the second signal storage unit. The electrical signal generation unit may be an optical charge generation unit, and each of the first and second signal storage units may include a conductive region formed by doping impurities into a substrate. The reset unit may include a transistor having a first electrode electrically connected to the second signal storage unit and a second electrode electrically connected to a device voltage node. The amplification unit may include a transistor having a gate electrode electrically connected to the second signal transmission unit and source and drain electrodes, one of which may be electrically connected to the device voltage node. The selection unit may include a transistor having a first electrode electrically coupled to a first electrode of the amplification unit and a second electrode electrically coupled to the output unit. The semiconductor device may further include a discharge unit having a first electrode coupled to the electrical signal generation unit and a second electrode coupled to a device voltage node.

At least one of the above and other features and advantages of the present invention may be realized by providing a CMOS image sensor that may include a pixel array, in which the pixel array may include a first pixel unit having a first signal generation unit, a first signal transmission unit electrically connected to the first signal generation unit, a first signal storage unit electrically connected to the first signal transmission unit, and a second signal transmission unit electrically connected to the first signal storage unit, a second signal storage unit electrically connected to the second signal transmission unit, a reset unit and an amplification unit electrically connected to the second signal storage unit, a selection unit electrically connected to the amplification unit, and an output unit electrically connected to the selection unit.

The reset unit may be a transistor having a first electrode electrically connected to the second signal storage unit and a second electrode electrically connected to a device voltage node. The amplification unit may be a transistor having a gate electrode electrically connected to the second signal storage unit, a first electrode electrically connected to a pixel voltage node, and a second electrode electrically connected to the selection unit. The selection unit may include a transistor having a first electrode electrically connected to the amplification unit and a second electrode electrically connected to the output unit.

The CMOS image sensor may further include a second pixel unit having a second signal generation unit, a third signal transmission unit electrically connected to the second signal generation unit, a third signal storage unit electrically connected to the third signal transmission unit, and a fourth signal transmission unit electrically connected to the second signal storage unit. The first signal transmission unit may include a transistor having a first source electrode and a first drain electrode, one of which may be electrically connected to the first signal generation unit and the other one which may be electrically connected to the first signal storage unit. The second signal transmission unit may include a transistor having a second source electrode and a second drain electrode, one of which may be electrically connected to the first signal storage unit and the other one which may be electrically connected to the second signal storage unit. The third signal transmission unit may include a transistor having a third source electrode and a third drain electrode, one of which may be electrically connected to the second signal generation unit and the other one which may be electrically connected to the second signal storage unit. The fourth signal transmission unit may include a transistor having a fourth source electrode and a fourth drain electrode, one of which may be electrically connected to the third signal storage unit and the other one which may be electrically connected to the second signal storage unit.

The pixel array may further include a first overflow transistor having a first electrode electrically connected to the first signal generation unit and a second electrode connected to a device voltage node, and a second overflow transistor having a first electrode electrically connected to the second signal generation unit and a second electrode connected to the device voltage node.

At least one of the above and other features and advantages of the present invention may be realized by providing a CMOS image sensor that may include an optical charge generation unit that may be formed within a substrate, a first transistor that may be formed on the substrate and may be adjacent to the optical charge generation unit, a first signal storage unit that may be formed within the substrate and may be adjacent to the first transistor, a second transistor that may be formed on the substrate and may be adjacent to the first signal storage unit, a second signal storage unit that may be formed within the substrate and may be adjacent to the second transistor, and a reset transistor that may be formed on the substrate and may be electrically connected to the second signal storage unit.

The first transistor may be formed on the second transistor such that the first transistor may partially overlap the second transistor. The CMOS image sensor may further include a third transistor that may be formed on the substrate adjacent to the optical charge generation unit, and the third transistor may have a source electrode and a drain electrode, one of which may be connected to a device voltage node. The CMOS image sensor may further include an amplifying transistor that may be formed on the substrate and may be electrically connected to the second signal storage unit, a selection transistor that may be electrically connected to the amplifying transistor, and an output transistor that may be electrically connected to the selection transistor. The second signal storage unit and the amplifying transistor may be electrically connected with polysilicon. A device voltage node may electrically connect to at least one of the reset transistor and the amplifying transistor, and the second signal storage may be electrically connected to the gate electrode of the amplifying transistor.

At least one of the above and other features of the present invention is to provide a CMOS image sensor that may include a first signal generation unit, a first signal transmission unit that may be adjacent to the first signal generation unit, a second signal transmission unit that may be formed to partially overlap the first signal transmission unit, a signal storage unit that may be adjacent to the second signal transmission unit, and a reset unit that may be adjacent to the signal storage unit.

The CMOS image sensor may further include a second signal generation unit, a third signal transmission unit that may be adjacent to the second signal generation unit, and a fourth signal transmission unit that may be formed to partially overlap the third signal transmission unit. The fourth signal transmission unit may be adjacent to the signal storage unit.

The CMOS image sensor may further include a fifth signal transmission unit that may be adjacent to the first signal transmission unit and the second signal transmission unit. The CMOS image sensor may further include an amplification unit and a selection unit.

BRIEF DESCRIPTION OF THE DRAWINGS

The above and other features and advantages of the invention will become more apparent to those of ordinary skill in the art by describing in detail exemplary embodiments thereof with reference to the attached drawings, in which:

FIGS. 8A to 8D illustrate layouts of CMOS image sensors according to various embodiments of the invention.

DETAILED DESCRIPTION OF THE INVENTION

Figure 1A:
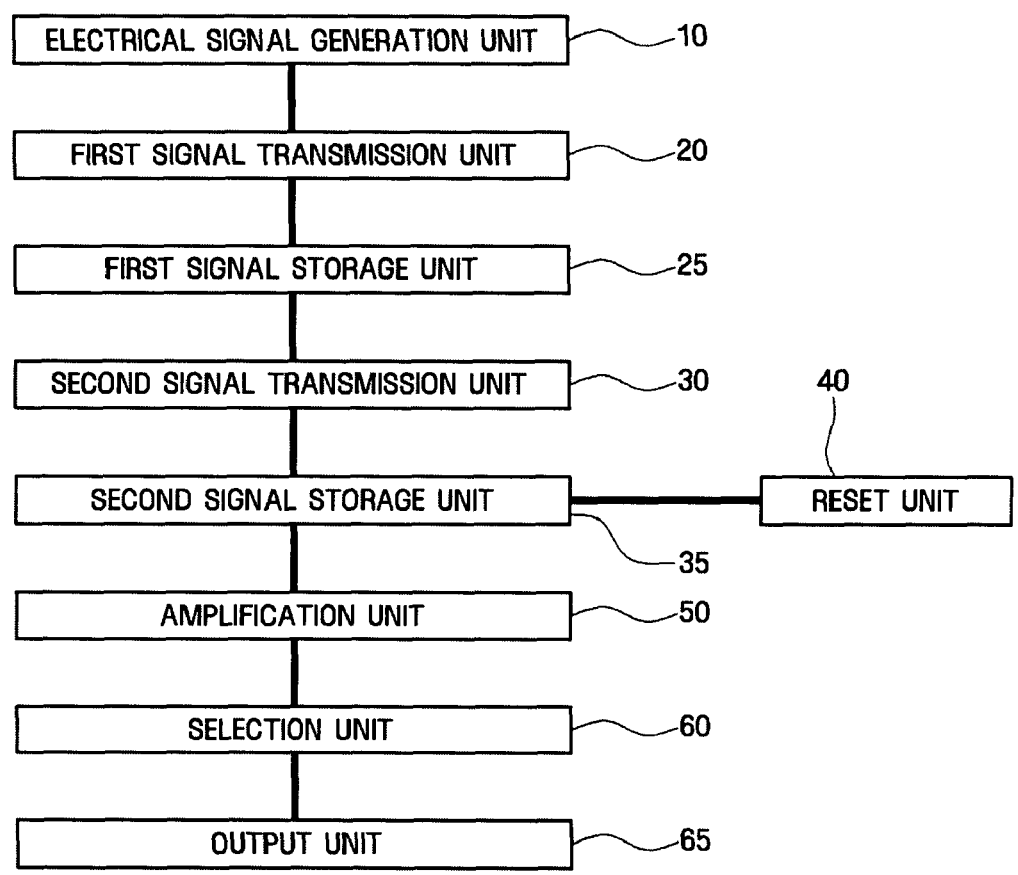
FIGS. 1A and 1B illustrate block diagrams explaining the basic configurations of semiconductor devices according to various embodiments of the invention.

Korean Patent Application No. 10-2006-0025023 filed on Mar. 17, 2006, in the Korean Intellectual Property Office, and entitled: "Semiconductor Device Having Temporary Signal Storage Unit," is incorporated by reference herein in its entirety.

The invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it may be directly on the other layer or substrate, or intervening layers may also be present. Further, it will be understood that when a layer is referred to as being "under" another layer, it may be directly under, and one or more intervening layers may also be present. In addition, it will also be understood that when a layer is referred to as being "between" two layers, it may be the only layer between the two layers, or one or more intervening layers may also be present. Like reference numerals refer to like elements throughout.

In some of the embodiments of the invention, an optical charge generation unit generating electrical signals by using received light may be depicted as a specific example. However, examples of devices that generate electrical signals may include all kinds of transducers or devices that generate electrical signals in response to pressure, heat, or physical or chemical stimuli, as well as the optical charge generation unit generating electrical signals by using the received light.

The invention will be described with reference to plan views and cross-sectional views, which are ideal schematic views. The embodiments of the invention are not limited to the specific forms that are shown.

A transistor may mean a field effect transistor (FET). In a field effect transistor, a source electrode and a drain electrode may be located at both sides of a gate electrode. The operation of the source and drain electrodes may be symmetrical, and the functions of the source and drain electrodes may be interchanged, that is, the source and drain electrodes may be symmetrical. Therefore, a source electrode referred in this specification may also be regarded as a drain electrode, and a drain electrode may also be regarded as a source electrode. These terms are used only to facilitate an easy understanding of the operation of the FET but do not limit the positions of electrodes of the FET. For this reason, the gate electrode of the FET is referred to as a "gate electrode", and the source electrode or the drain electrode is referred to as a "first electrode" or a "second electrode". Here, the "first electrode" may mean one of the source and drain electrodes, and the "second electrode" means the other electrode.

Further, the term "connected" in this specification may mean "electrically connected". The meaning of "connected" may include a direct physical connection or an indirect connection using a capacitor, a reactor, a resistor, or other electrical elements. In other words, the meaning of "connected" may include "coupled" in addition to "connected". In some parts of this specification, the term "connected" may be used to make the technology of the invention more easily understood. Furthermore, the term "coupled" may be omitted to prevent the disclosure from becoming complicated due to expressing "connected or coupled" for each explanation. However, in some parts of the disclosure, the term "coupled" may be necessarily used to indicate that the term "connected" should not be regarded as a limiting term.

Furthermore, a term "device voltage node" may be used. The "device voltage node" may be a node at which a maximum voltage Vdd or a minimum voltage Vss is applied, the maximum voltage Vdd or the minimum voltage Vss being a voltage applied to a typical semiconductor device. Also, in a semiconductor device having a cell region, the "device voltage node" may be a node at which a maximum voltage Vcc or a minimum voltage Vss is applied, and the maximum voltage Vcc or the minimum voltage Vss may be a voltage used within the cell. The minimum voltage Vss may be a common voltage used within a semiconductor device, and device voltages Vdd and Vcc may be different from each other or equal to each other. More specifically, the device voltage Vdd may be higher or lower than the cell voltage Vcc. This is because, when designing a semiconductor device, a designer may use various potentials so as to obtain desired operation characteristics of the semiconductor device. Therefore, the terms "device voltage node" and "cell voltage node" used in this specification may be regarded as being interchangeable. For this reason, in this specification, the terms of "device voltage node" and "cell voltage node" are commonly called "device voltage node".

A semiconductor device according to an embodiment of the invention will be described in detail with reference to the accompanying drawings.

FIG. 1A illustrates a block diagram explaining the basic configuration of a semiconductor device according to an embodiment of the invention. Connection lines between blocks mean that electrical signals may be transmitted between the blocks.

Referring to FIG. 1A, a semiconductor device may include an electrical signal generation unit 10, a first signal transmission unit 20 electrically connected to the electrical signal generation unit 10, a first signal storage unit 25 electrically connected to the first signal transmission unit 20, a second signal transmission unit 30 electrically connected to the first signal storage unit 25, a second signal storage unit 35 electrically connected to the second signal transmission unit 30, a reset unit 40 electrically connected to the second signal storage unit 35, an amplification unit 50 electrically connected to the second signal storage unit 35, a selection unit 60 electrically connected to the amplification unit 50, and an output unit 65 electrically connected to the selection unit 60.

The electrical signal generation unit 10 may be an optical charge generation unit, e.g., a photodiode, which generates electrical signals in response to incident light. Specifically, the intensity of an electrical signal or the amount of charges may be changed depending on the intensity of the incident light. An electrical signal with low intensity or a small amount of charge may be generated when a small amount of light is received, and an electrical signal with high intensity or a high amount of charges may be generated when a large amount of light is received. The optical signal generation unit 10 may have differing sensitivities to different intensities of incident light.

The first signal transmission unit 20 may be turned on or off, so that the first signal transmission unit 20 may transmit electrical signals generated in the electrical signal generation unit 10 to the first signal storage unit 25. Specifically, the first signal transmission unit 20 may transmit the electrical signals generated in the electrical signal generation unit 10 to the first signal storage unit 25 when the first signal transmission unit 20 is turned on, but the first signal transmission unit 20 may not transmit the electrical signals generated in the electrical signal generation unit 10 to the first signal storage unit 25 when the first signal transmission unit 20 is turned off. More specifically, the first signal transmission unit 20 may include one or more transistors. Either a source electrode or a drain electrode of each of the transistors included in the first signal transmission unit 20 may be electrically connected to the electrical signal generation unit 10. Alternatively, either the source electrode or the drain electrode of each of the transistors may be electrically connected to the first signal storage unit 25. A gate electrode of the transistor included in the first signal transmission unit 20 may be turned on or off in response to a control signal supplied from a control unit (not shown).

The first signal storage unit 25 may temporarily store the electrical signals transmitted from the first signal transmission unit 20. Specifically, the first signal storage unit 25 may be composed of a conductive region and may serve as a capacitor capable of storing electrical signals when floated. More specifically, the first signal storage unit 25 may be a capacitor, and the first signal storage unit 25 may be an impurity-doped region where charges may be stored when floated.

The second signal transmission unit 30 may be turned on or off, so that the second signal transmission unit 30 may serve to transmit electrical signals stored in the first signal storage unit 25 to the second signal storage unit 35. Specifically, the second signal transmission unit 30 may transmit the electrical signals stored in the first signal storage unit 25 to the second signal storage unit 35 when the second signal transmission unit 30 is turned on. However, the second signal transmission unit 30 may not transmit the electrical signals stored in the first signal storage unit 25 to the second signal storage unit 35 when the second signal transmission unit 30 is turned off. More specifically, the second signal transmission unit 30 may include one or more transistors. Either a source electrode or a drain electrode of each of the transistors included in the second signal transmission unit 30 may be electrically connected to the first signal storage unit 25. Alternatively, either the source electrode or the drain electrode of each of the transistors may be electrically connected to the second signal storage unit 35. A gate electrode of the transistor included in the second signal transmission unit 30 may be turned on or off in response to a control signal supplied from a control unit (not shown).

The second signal storage unit 35 may temporarily store the electrical signals transmitted from the second signal transmission unit 30. Specifically, the second signal storage unit 35 may be composed of a conductive region and may serve as a capacitor capable of storing electrical signals when floated. Further, second signal storage unit 35 may serve as a signal transmission line by which the electrical signals transmitted from the second signal transmission unit 30 may be transmitted to other components, such as the reset unit 40 or the amplification unit 50. The second signal storage unit 35 may be a capacitor, and the second signal storage unit 35 may be an impurity-doped region where charges may be stored when floated.

The reset unit 40 may be turned on or off. When the reset unit 40 is turned on, the reset unit 40 may perform a reset operation in which electrical signals may be input to the second signal storage unit 35 or electrical signals stored in the second signal storage unit 35 may be output. Specifically, the reset unit 40 may include transistors. Either a source electrode or a drain electrode of each of the transistors included in the reset unit 40 may be electrically connected to the second signal storage unit 35 or a device voltage node. Further, the transistors included in the reset unit 40 may be turned on or off in response to electrical signals input to gate electrodes, where the electrical signals may be generated in a reset control unit (not shown). More specifically, when the electrical signal generated in the reset control unit is applied to the gate electrode so as to turn on the transistor, the reset unit 40 may either i) output electrical signals stored in the second signal storage unit 35, or ii) input electrical signals to the second signal storage unit 35 by electrically shorting the second signal storage unit 35 and the device voltage node.

The amplification unit 50 may be electrically connected to the second signal storage unit 35, and the amplification unit 50 may output electrical signals that are amplified corresponding to the intensity of the electrical signals stored in the second signal storage unit 35. Specifically, the amplification unit 50 may include one or more transistors. When electrical signals are supplied from the second signal storage unit 35 to gate electrodes of the transistors, the amplification unit 50 may generate electrical signals that are amplified. Either a source electrode or a drain electrode of each of the transistors may be electrically connected to the selection unit 60 or the cell voltage node. More specifically, the transistors included in the amplification unit 50 may be turned on when electrical signals are applied from the second signal storage unit 35 to the gate electrodes of the transistors. When the transistors are turned on, the electrical signals may be transmitted from the cell voltage node to the selection unit 60. When the second signal storage unit 35 is reset by the operation of the reset unit 40, the transistors included in the amplification unit 50 may be turned off.

The selection unit 60 may serve to selectively transmit the electrical signals, which have been transmitted from the amplification unit 50, to the output unit 65. Specifically, the selection unit 60 may include one or more transistors and may transmit electrical signals, which may have been transmitted from the amplification unit 50 in response to a selection command from a selection control unit (not shown), to the output unit 65. Gate electrodes of the transistors included in the selection unit 60 may be electrically connected to the selection control unit, so that the transistors may turn on or off in response to the selection command transmitted through electrical signals. The electrical signals transmitted from the amplification unit 50 may be transmitted to the output unit 65 when the transistors are turned on, but the electrical signals transmitted from the amplification unit 50 may not be transmitted to the output unit 65 when the transistors are turned off. That is, source electrodes or drain electrodes of the transistors may be electrically connected to the amplification unit 50 or the output unit 65.

The output unit 65 may transmit the electrical signals transmitted from the selection unit 60 to the outside or to functional components that perform specific functions. Specifically, the output unit 65 may be a signal transmission line by which electrical signals are transmitted. Alternatively, the output unit 65 may be formed from functional components that perform amplification or buffering.

Hereafter, operation of the semiconductor device illustrated in FIG. 1A will be described.

First, when the electrical signal generation unit 10 generates electrical signals, the first signal transmission unit 20 may be turned on or off to transmit the electrical signals to the first signal storage unit 25. The first signal storage unit 25 may temporarily store the electrical signals transmitted from the first signal transmission unit 20. The second signal transmission unit 30 may be turned on or off to transmit the electrical signals stored in the first signal storage unit 25 to the second signal storage unit 35. At this time, the first signal transmission unit 20 and the second signal storage unit 35 may be independently turned on or off according to separate control signals. The second signal storage unit 35 may then temporarily store the electrical signals transmitted from the second signal transmission unit 30 and transmit the electrical signals to the reset unit 40 or the amplification unit 50. Then, the amplification unit 50 may output electrical signals, which are obtained by amplifying the electrical signals transmitted from the second signal storage unit 35, to the selection unit 60. The amplification unit 50 may output electrical signals that are amplified in proportion to the intensity of the electrical signals transmitted from the second signal storage unit 35. Then, the selection unit 60 may be turned on or off to output the electrical signals transmitted from the amplification unit 50 to the output unit 65. The selection unit 60 may be turned on or off in response to a selection control signal. The output unit 65 may transmit the electrical signals output from the selection unit 60 to the outside or to other functional components. When the selection unit 60 is turned on to output electrical signals, the reset unit 40 may be turned on by a received reset signal so that the second signal storage unit 35 may be reset.

Figure 1B:
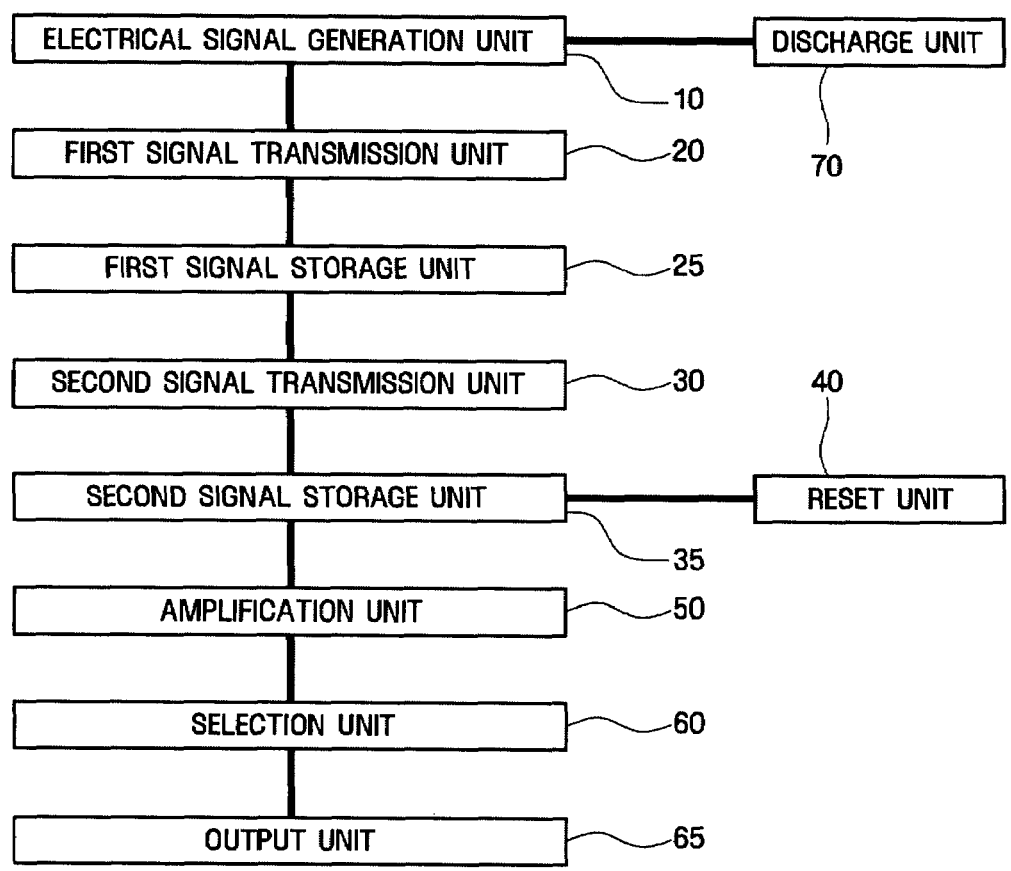

FIG. 1B illustrates a block diagram explaining the basic configuration of a semiconductor device according to another embodiment of the invention. Connection lines between blocks mean that electrical signals may be transmitted between the blocks.

In FIG. 1B, the semiconductor device may include an electrical signal generation unit 10, a first signal transmission unit 20 electrically connected to the electrical signal generation unit 10, a first signal storage unit 25 electrically connected to the first signal transmission unit 20, a second signal transmission unit 30 electrically connected to the first signal storage unit 25, a second signal storage unit 35 electrically connected to the second signal transmission unit 30, a reset unit 40 electrically connected to the second signal storage unit 35, an amplification unit 50 electrically connected to the second signal storage unit 35, a selection unit 60 electrically connected to the amplification unit 50, an output unit 65 electrically connected to the selection unit 60, and a discharge unit 70.

The configuration of the device, except for the discharge unit 70, has been described above in FIG. 1A, and an explanation of redundant components will be omitted.

When the first signal transmission unit 20 is turned off, the discharge unit 70 may discharge electrical signals if electrical signals generated in the electrical signal generation unit 10 are excessive. Specifically, the discharge unit 70 may include one or more transistors. Either a source electrode or a drain electrode of each of the transistors may be electrically connected to the electrical signal generation unit 10. The transistors included in the discharge unit 70 may be turned on by a control signal so that the electrical signals generated in the electrical signal generation unit 10 may be discharged. Alternatively, the discharge unit 70 may always be in a turned-on state with a threshold voltage. If the discharge unit 70 is turned on by the control signal, the first signal transmission unit 20 may be first turned on to transmit the electrical signals generated in the electrical signal generation unit 10 to the first signal storage unit 25, and then turned off. Next, the discharge unit 70 may be turned on by the control signal, and it may be possible to discharge electrical signals that are excessively or continuously generated in the electrical signal generation unit 10 and then turned off. The discharge unit 70 may be electrically connected to the device voltage node.

Next, a CMOS image sensor according to another embodiment of the invention will be described.

Figure 2A:
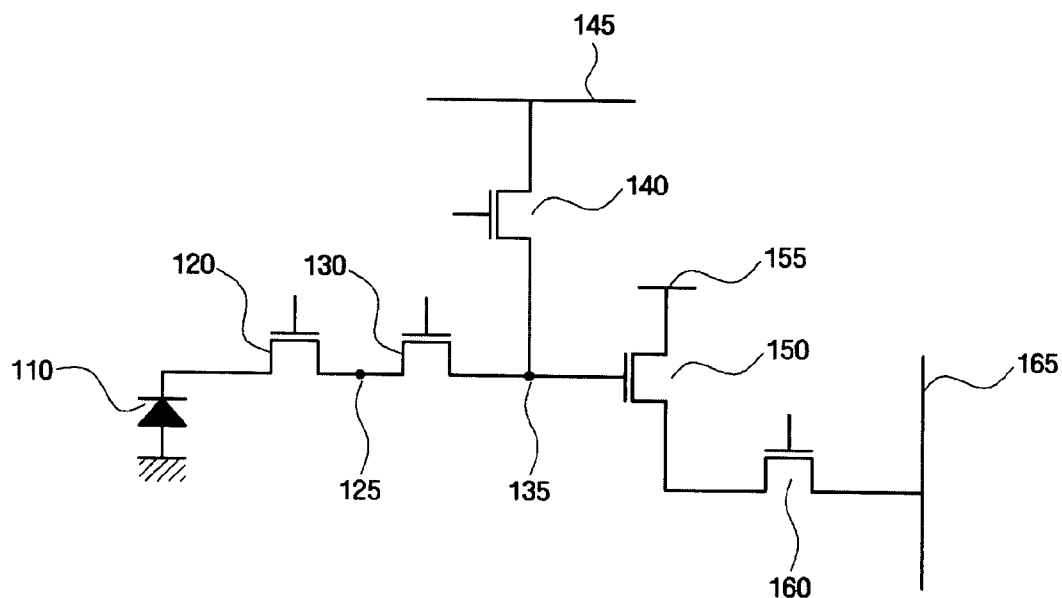
FIGS. 2A to 2C illustrate circuit diagrams of CMOS image sensors according to various embodiments of the invention.

FIG. 2A illustrates a circuit diagram of a CMOS image sensor according to another embodiment of the invention. In particular, a circuit capable of performing one-step signal processing will be explained as a representative example.

In FIG. 2A, the CMOS image sensor may include an optical charge generation unit 110, e.g., a photodiode, that generates electrical signals by using absorbed light. A first transistor 120 having a first electrode may be electrically connected to the optical charge generation unit 110 and a second electrode to which the electrical signals generated in the optical charge generation unit 110 are transmitted. A first conductive unit 125 that may be electrically connected to the second electrode of the first transistor 120, and the first conductive unit 125 may receive and store electrical signals transmitted from the first transistor 120. A second transistor 130 may have a first electrode electrically connected to the first conductive unit 125 and a second electrode to which the electrical signals generated in the first conductive unit 125 may be transmitted. A second conductive unit 135 may be electrically connected to the second electrode of the second transistor 130, and the second conductive unit 135 may receive and store electrical signals transmitted from the second transistor 130. A first reset transistor 140 may have a first electrode electrically connected to the second conductive unit 135 and a second electrode connected to a first device voltage node 145, and the first reset transistor may reset the second conductive unit 135 by using a reset signal applied to a gate thereof. An amplifying transistor 150 may have a gate electrode electrically connected to the second conductive unit 135, a first electrode connected to a second device voltage node 155, and a second electrode electrically connected to a first electrode of a selection transistor 160. The selection transistor 160 may have a first electrode electrically connected to the second electrode of the amplifying transistor 150, and the selection transistor 160 may transmit electrical signals of the first electrode to a second electrode thereof in response to a turn-on/turn-off signal applied to the gate thereof. An output line 165 may electrically connect to the second electrode of the selection transistor 160.

The optical charge generation unit 110 may be a photodiode that generates electrical signals by using absorbed light.

Since the gate electrode of each of the first transistor 120 and the second transistor 130 electrically connects to the control unit (not shown), the first transistor 120 and second transistor 130 may be turned on or off in response to electrical signals generated in the control unit. The first transistor 120 and the second transistor 130 may operate independently from each other.

Each of the first conductive unit 125 and the second conductive unit 135 may be a region of a semiconductor substrate into which impurities may be doped so as to have conductivity. For example, boron, phosphorus, arsenic, or the like may be doped into the region, and in particular, group V impurities, e.g., phosphorus or arsenic, may be doped into the region. Alternatively, the first conductive unit 125 and the second conductive unit 135 may be capacitors.

The first reset transistor 140 may reset the second conductive unit 135 in response to a reset signal, which may be applied to the gate electrode from the reset control unit (not shown), and the second electrode of the first reset transistor 140 may be electrically connected to the first device voltage node 145.

The amplifying transistor 150 may operate as a source follower in which the amount of charges to be output to the first electrode may be adjusted on the basis of the intensity of electrical signals applied to the gate electrode, and the second electrode of the amplifying transistor 150 may be connected to the second device voltage node 155. In particular, electrical connection between the second conductive unit 135 and the amplifying transistor 150 may be made by using, e.g., polysilicon. Leakage current may be minimized when the polysilicon is used.

The selection transistor 160 may be turned on or off in response to a selection signal that may be applied to the gate electrode from the selection control unit (not shown), and the selection transistor 160 may transmit the electrical signals, which are transmitted from the first electrode of the amplification transistor 150, to the output line 165.

The structure encompassing the optical charge generation unit 110 to the selection transistor 160 may be considered a pixel in a broad sense. Alternately, the structure encompassing the optical charge generation unit 110 to the second transistor 130 may be considered a pixel in a narrow sense.

Operation of the CMOS image sensor shown in FIG. 2A will be briefly described.

When the optical charge generation unit 110 absorbs incident light, the optical charge generation unit 110 may generate electrical signals proportional to the intensity of the light. Then, the first transistor 120 may be turned on to transmit the electrical signals generated by the optical charge generation unit 110 to the first conductive unit 125, and the first transistor 120 may then be turned off. Then, the first conductive unit 125 may temporarily store the electrical signals transmitted from the first conductive unit 125. The second transistor 130 may subsequently turn on to transmit the electrical signals stored in the first conductive unit 125 to the second conductive unit 135, and the second transistor 130 may then be turned off. The second conductive unit 135 may then transmit the electrical signals transmitted from the second conductive unit 135 to the gate electrode of the amplifying transistor 150. Subsequently, the amplifying transistor 150 may transmit electrical signals, which may be amplified corresponding to the intensity of the electrical signals applied to the gate, to the first electrode of the selection transistor 160. Then, the selection transistor 160 may turn on in response to a turn-on signal applied to the gate, the electrical signals transmitted to the first electrode may be transmitted to the output line 165, and the selection transistor 160 may then be turned off. Then, a reset signal may be applied to the gate electrode of the first reset transistor 140 so as to reset the second conductive unit 135. Thus, an operation during a period for which a pixel outputs an electrical signal may be completed.

In the CMOS image sensor, since the first transistor 120 may be turned off after transmitting electrical signals to the first conductive unit 125, other electrical signals may not be further transmitted to the first conductive unit 125 to the output line 165. Therefore, it may be possible to prevent signals from being distorted due to continuous transmissions of electrical signals.

Figure 2B:
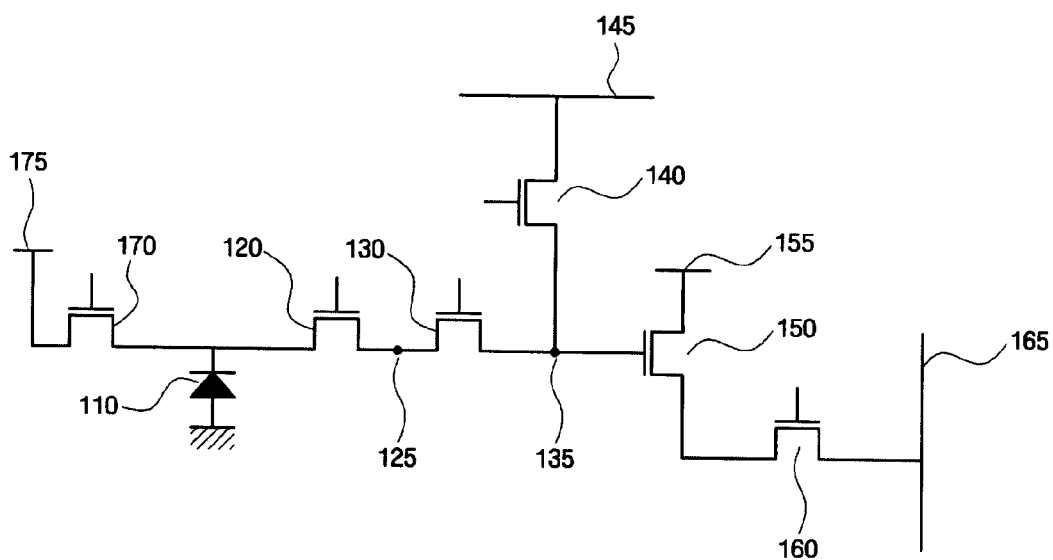

FIG. 2B illustrates a circuit diagram of a CMOS image sensor according to another embodiment of the invention.

FIG. 2B depicts a CMOS image sensor that may be similar to that shown in FIG. 2A but may further include an overflow transistor 170 having a first electrode that may electrically connect to the optical charge generation unit 110.

A second electrode of the overflow transistor 170 may electrically connect to a third device voltage node 175.

The CMOS image sensor shown in FIG. 2B may further perform an operation in which the overflow transistor 170 may be turned on if electrical signals generated in the optical charge generation unit 110 are excessive after the first transistor 120 is turned off. Alternately, the overflow transistor 170 may be turned on when the first transistor 120 is turned off so that electrical signals continuously generated in the optical charge generation unit 110 are discharged to the third device voltage node 175. These functions may be in addition to the operations of the CMOS image sensor described with reference to FIG. 2A.

In the CMOS image sensor shown in FIG. 2B, excessive or unnecessary electrical signals generated in the optical charge generation unit 110 may be discharged through the overflow transistor 170. Accordingly, operation of the CMOS image sensor may be stabilized.

Figure 2C:
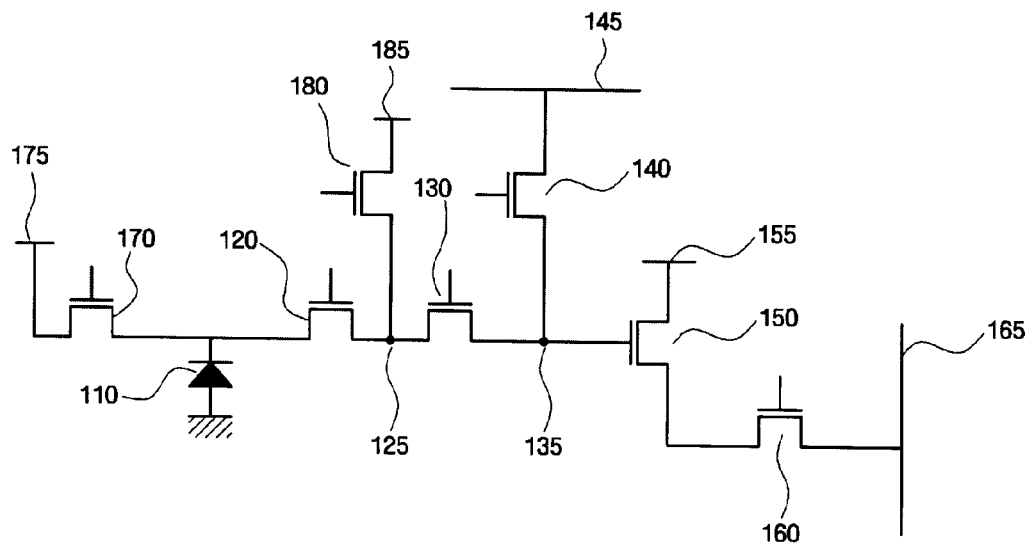

FIG. 2C illustrates a circuit diagram of a CMOS image sensor according to another embodiment of the invention.

FIG. 2C depicts a CMOS image sensor that may be similar to that shown in FIG. 2A and FIG. 2B, but may further include a second reset transistor 180 having a first electrode that may be electrically connected to the first conductive unit 125.

A second electrode of the second reset transistor 180 may be connected to a device voltage node 185, and the second reset transistor 180 may reset the first conductive unit 125 in response to a reset signal applied to a gate thereof from a control unit (not shown).

Figure 3A:
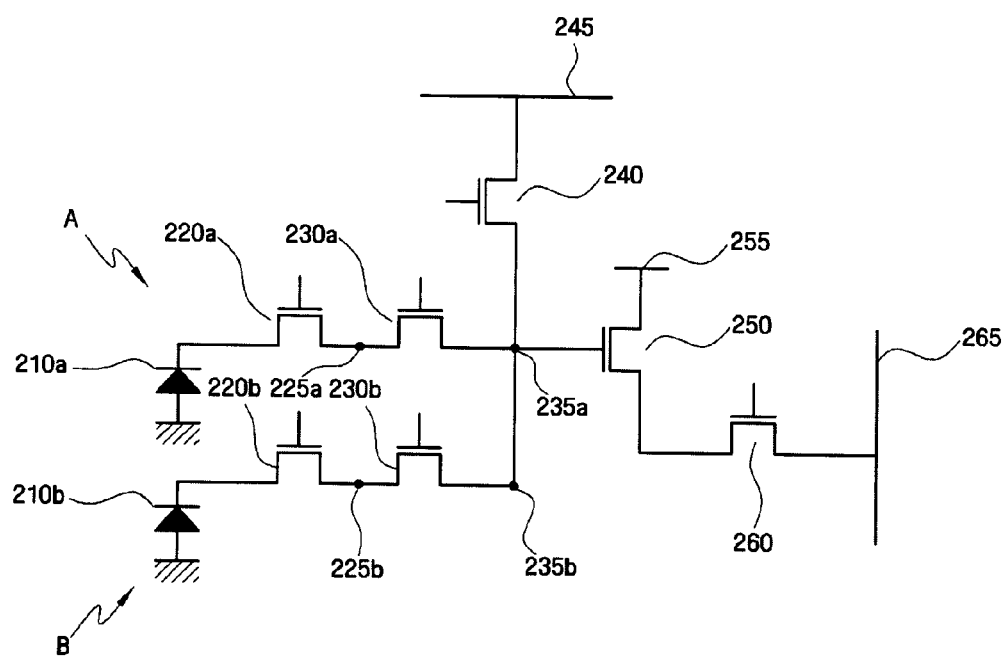
FIGS. 3A to 3C illustrate circuit diagrams of pixel arrays of the CMOS image sensors according to various embodiments of the invention.

FIG. 3A illustrates a circuit diagram of a pixel array of a CMOS image sensor according to another embodiment of the invention.

In FIG. 3A, the pixel array of the CMOS image sensor may include a first pixel unit A having a first signal generation unit 210*a*, a first signal transmission unit 220*a* electrically connected to the first signal generation unit 210*a*, a first signal storage unit 225*a* electrically connected to the first signal transmission unit 220*a*, and a second signal transmission unit 230*a* electrically connected to the first signal storage unit 225*a*. A second pixel unit B may have a second signal generation unit 210*b*, a third signal transmission unit 220*b* electrically connected to the second signal generation unit 210*b*, a second signal storage unit 225*b* electrically connected to the third signal transmission unit 220*b*, and a fourth signal transmission unit 230*b* electrically connected to the second signal storage unit 225*b*. A third signal storage unit 235*a* and a fourth signal storage unit 235*b* may be are electrically connected to the second signal transmission unit 230*a* of the first pixel unit A and the fourth signal transmission unit 230*b* of the second pixel unit B.

The pixel array of FIG. 3A may further include a first reset unit 240 and an amplification unit 250 that may be electrically connected to the third signal storage unit 235*a* and the fourth signal storage unit 235*b*, a selection unit 260 that may be electrically connected to the amplification unit 250, and an output unit 265 that may be electrically connected to the selection unit 260. The first reset transistor 240 may have an electrode connected to a device voltage node 245.

Since the third signal storage unit 235*a* and the fourth signal storage unit 235*b* may be electrically connected to each other, the third signal storage unit 235*a* and the fourth signal storage unit 235*b* may accordingly be replaced with one signal storage unit. This will be described in detail below when explaining a circuit operation.

The functions and operation of the first signal generation unit 210*a* to the second signal transmission unit 230*a*, and the function and operations of the second signal generation unit 210*b* to the fourth signal transmission unit 230*b*, may be understood in light of the above explanation made with reference to FIG. 2A.

The two pixel units A and B shown in FIG. 3A may sequentially output electrical signals. The second signal transmission unit 230*a* and the fourth signal transmission unit 230*b* may not be simultaneously turned on. Accordingly, the third signal storage unit 235*a* and the fourth signal storage unit 235*b* may not simultaneously store the transmitted electrical signals. Thus, the third signal storage unit 235*a* and the fourth signal storage unit 235*b* may be integrated into one component. Even though the third signal storage unit 235*a* and the fourth signal storage unit 235*b* may be shown as separate components in the drawings in order to make the invention and its operation easily understood, the third signal storage unit 235*a* and the fourth signal storage unit 235*b* may be considered as one unified component.

Basically, the signal transmission units 220*a*, 220*b*, 230*a*, and 230*b* included in the two pixel units A and B may operate independently from one another. On the other hand, the first signal transmission unit 220*a* and the third signal transmission unit 220*b* may be simultaneously turned on or off by using one kind of control signal. However, when the second signal transmission unit 230*a* and the fourth signal transmission unit 230*b* are simultaneously turned on, two kinds of electrical signals may interfere with each other in the third signal storage unit 235*a* and the fourth signal storage unit 235*b*. For this reason, the second signal transmission unit 230*a* and the fourth signal transmission unit 230*b* may not be simultaneously turned on. In contrast, even if the first signal transmission unit 220*a* and the third signal transmission unit 220*b* are simultaneously turned on, the electrical signals may be stored in the first signal storage unit 225*a* and the second signal storage unit 225*b*, and accordingly, the two kinds of electrical signals do not interfere with each other. Thus, the first signal transmission unit 220*a* and the third signal transmission unit 220b may be simultaneously turned on or off by using one kind of control signal.

Next, an operation of outputting electrical signals generated in the two pixel units A and B will be briefly described. That is, operation in which two kinds of electrical signals are output will be described.

First, the signal generation units 210a and 210b of the pixel units A and B may generate electrical signals. Then, the first signal transmission unit 220a and the third signal transmission unit 220b may be turned on to transmit the electrical signals to the first signal storage unit 225a and the second signal storage unit 225b, and the electrical signals may be stored in the first signal storage unit 225a and the second signal storage unit 225b. Then, the second signal transmission unit 230a may be turned on to transmit the electrical signal stored in the first signal storage unit 225a to the third signal storage unit 235a. The electrical signal transmitted to the third signal storage unit 235a may be applied to the amplification unit 250, and the amplification unit 250 transmits an electrical signal, which may be amplified corresponding the intensity of the electrical signal that has been applied, to the selection unit 260. The amplification unit may have a voltage node 255. Then, the selection unit 260 may be turned on to output the electrical signal, which may have been transmitted from the amplification unit 250, to the output unit 265, and thus the selection unit 260 may be turned off. At the same time as the electrical signal may be output to the output unit 265, the first reset unit 240 may be turned on to reset the third signal storage unit 235a. When the first reset unit 240 is turned off, the fourth signal transmission unit 230b may be turned on to transmit the electrical signal, which has been stored in the second signal storage unit 225b, to the fourth signal storage unit 235b. The electrical signal transmitted to the fourth signal storage unit 235b may be applied to the amplification unit 250, and the amplification unit 250 may generate an electrical signal, which may be amplified corresponding to the intensity of the electrical signal that has been applied, to the selection unit 260. Then, the selection unit 260 may be turned on to output the electrical signal, which has been transmitted from the amplification unit 250, to the output unit 265, and thus the selection unit 260 may be turned off. Then, at the same time as the electrical signal may be output to the output unit 265, the first reset unit 240 may be turned on to reset the fourth signal storage unit 235b. As such, an operation, which may be performed during a period, of the CMOS image sensor shown in FIG. 3A may be completed.

Figure 3B:
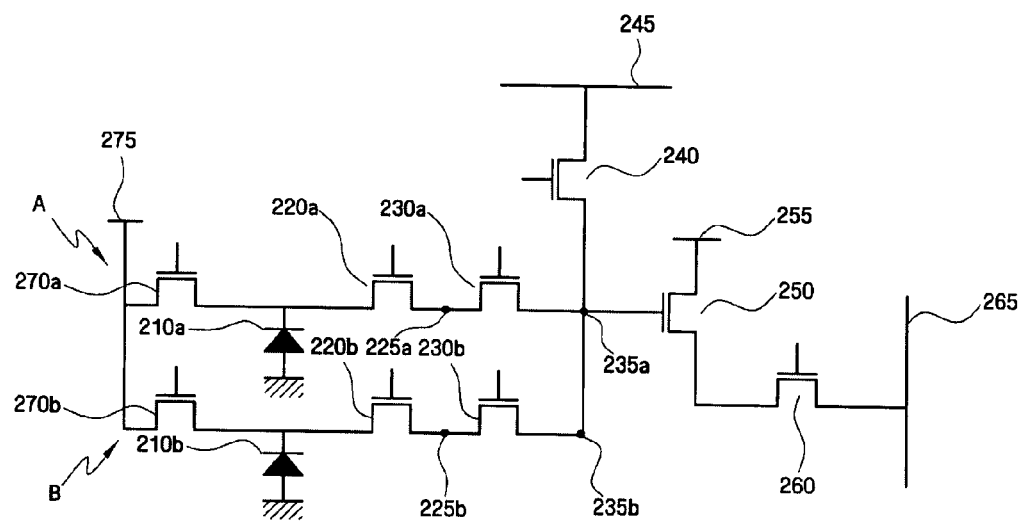

FIG. 3B illustrates a circuit diagram of a pixel array of a CMOS image sensor according to another embodiment of the invention.

In FIG. 3B, the first pixel unit A explained with reference to FIG. 3A may further include a first discharge unit 270a, and the second pixel unit B explained with reference to FIG. 3A may further include a second discharge unit 270b.

The first discharge unit 270a may discharge excessive electrical signals generated in the first signal generation unit 210a, or the first discharge unit 270a may be turned on when the first signal transmission unit 220a is turned off so that electrical signals continuously generated in the first signal generation unit 210a may discharge. Further, the second discharge unit 270b may discharge excessive electrical signals generated in the second signal generation unit 210b, or the second discharge unit 270b may be turned on when the second signal transmission unit 220b is turned off so that electrical signals generated in the second signal generation unit 210b may discharge.

The first discharge unit 270a and the second discharge unit 270b may be electrically connected to a common node, and the common node may be electrically connected to a third device voltage node 275.

Figure 3C:
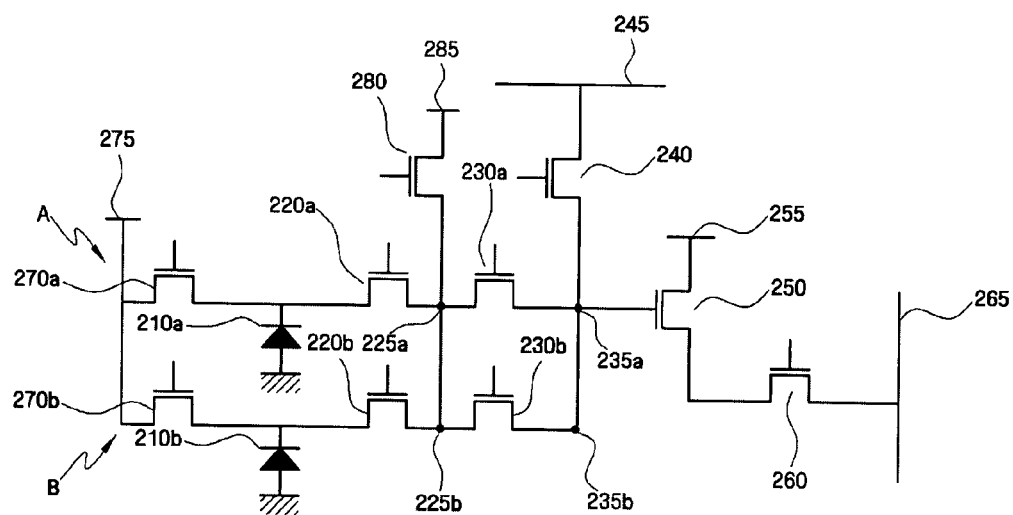

FIG. 3C illustrates a circuit diagram of a pixel array of a CMOS image sensor according to another embodiment of the invention.

FIG. 3C includes a pixel array of the CMOS image sensor that may further include a second reset unit 280 having a first electrode that may be electrically connected to the first signal storage unit 225a and the second signal storage unit 225b.

A second electrode of the second reset unit 280 may connect to a fourth device voltage node 285, and the second reset unit 280 may reset the first conductive unit 125 in response to a reset signal applied to a gate electrode thereof from a control unit (not shown).

Figure 4A:
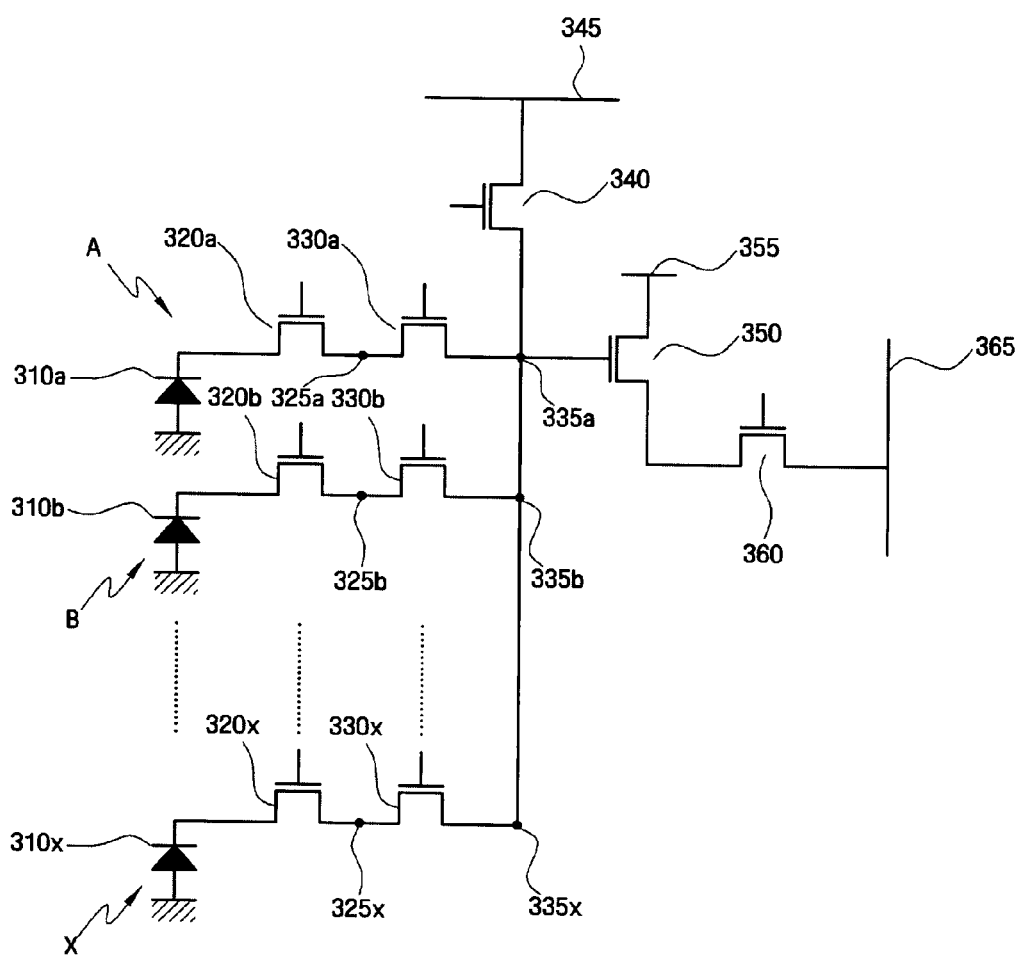
FIGS. 4A to 4C illustrate circuit diagrams of pixel arrays of CMOS image sensors having multi pixels according to various embodiments of the invention.

FIG. 4A illustrates a circuit diagram of a pixel array of a CMOS image sensor having multi pixels according to another embodiment of the invention.

In FIG. 4A, the pixel array of the CMOS image sensor may include a first pixel unit A that may have a first signal generation unit 310a, a first signal transmission unit 320a electrically connected to the first signal generation unit 310a, a first signal storage unit 325a electrically connected to the first signal transmission unit 320a, and a second signal transmission unit 330a electrically connected to the first signal storage unit 325a. A second pixel unit B may have a second signal generation unit 310b, a third signal transmission unit 320b electrically connected to the second signal generation unit 310b, a second signal storage unit 325b electrically connected to the third signal transmission unit 320b, and a fourth signal transmission unit 330b electrically connected to the second signal storage unit 325b. A third signal storage unit 335a and a fourth signal storage unit 335b may be electrically connected to the second signal transmission unit 330a of the first pixel unit A and the fourth signal transmission unit 330b of the second pixel unit B. The pixel array may continue until a final nth pixel unit X that may have an nth signal generation unit 310x, an nth signal transmission unit 320x electrically connected to the nth signal generation unit 310x, an nth signal storage unit 325x electrically connected to the nth signal transmission unit 320x, and an nth signal transmission unit 330x electrically connected to the nth signal storage unit 325x. An nth signal storage unit 335x and an nth signal storage unit 335x may eventually be electrically connected to the second signal transmission unit 330a of the first pixel unit A and the fourth signal transmission unit 330b of the second pixel unit B.

The pixel array of FIG. 4A may further include a first reset unit 340 and an amplification unit 350 that may be electrically connected to the third signal storage unit 335a, the fourth signal storage unit 335b up to the nth signal storage unit 335x. The amplification unit 350 may have voltage node 355. A selection unit 360 may be electrically connected to the amplification unit 350, and an output unit 365 that may be electrically connected to the selection unit 360. The first reset transistor 340 may have an electrode connected to a device voltage node 345. Since the signal storage units 335a, 335b ... 335x may be electrically connected to each other, the signal storage units 335a, 335b ... 335x may accordingly be replaced with one signal storage unit.

In FIG. 4A, reference numeral "x" may be used to denote any number of elements. Taking the bit configuration of a typical semiconductor device into consideration, "x" may be a number corresponding to $2^N$, e.g., 4, 8, 16, 64, or 256, but is not limited thereto.

Figure 4B:
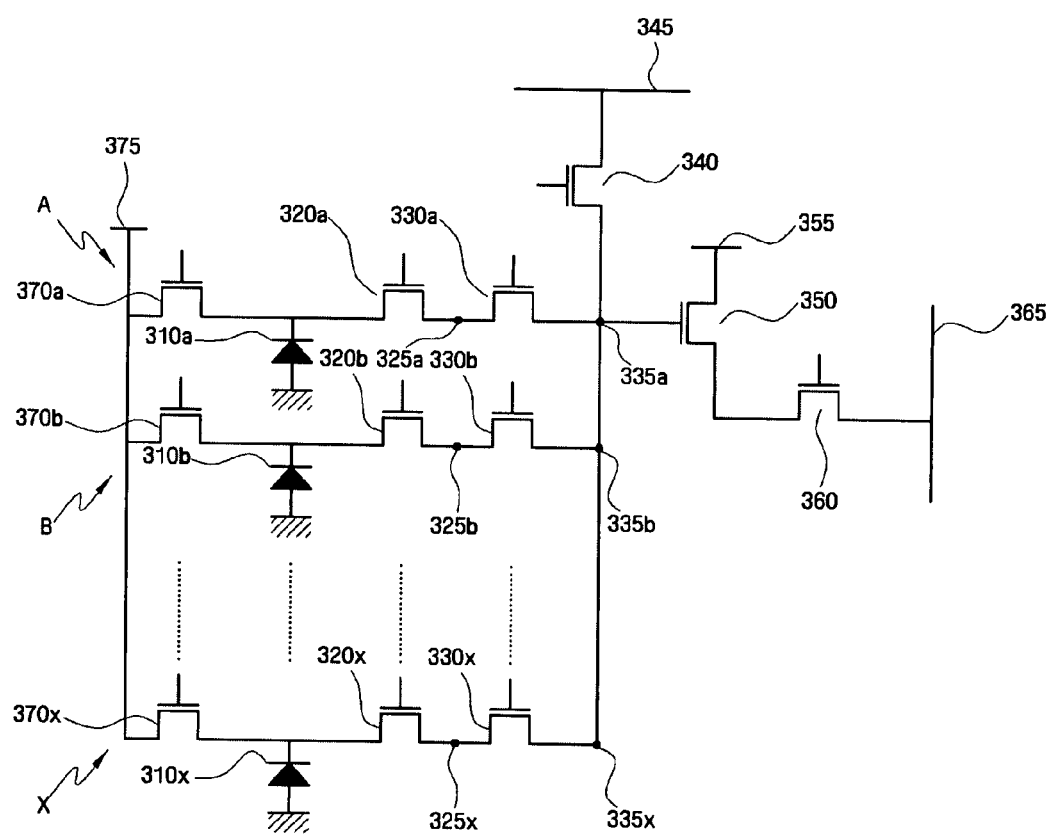

FIG. 4B illustrates a circuit diagram of a pixel array of a CMOS image sensor having multi pixels according to another embodiment of the invention.

In FIG. 4B, the pixel array of the CMOS image sensor having multi pixels includes multiple pixel units A and B, as typically are shown in FIG. 3B. In FIG. 4B, reference numeral "x" may be used to denote multiple elements. Here, "x" may be a number corresponding to $2^N$, e.g., 4, 8, 16, 64, or 256, but may be not limited thereto.

Multiple discharge units 370a, 370b . . . 370x may be electrically connected to a common node that electrically connects to a third device voltage node 375.

Figure 4C:
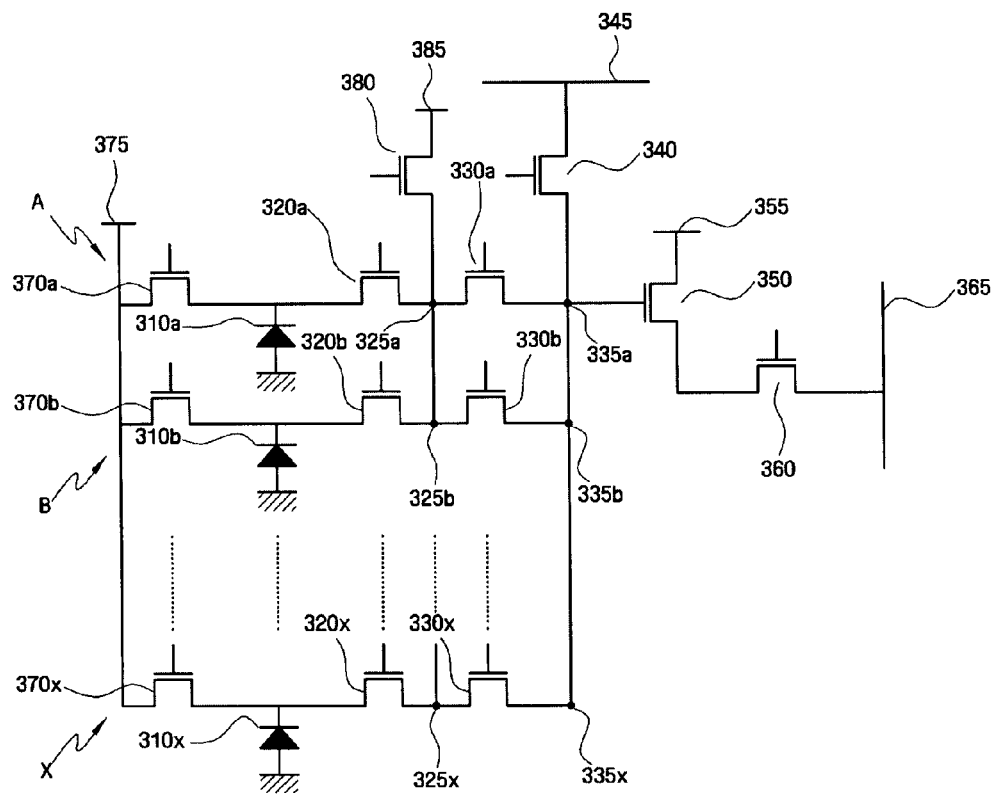

FIG. 4C illustrates a circuit diagram of a pixel array of a CMOS image sensor having multi pixels according to another embodiment of the invention.

In FIG. 4C, the pixel array of the CMOS image sensor having multi pixels multiple pixel units A and B, as are typically shown in FIG. 3B. In FIG. 4C, reference numeral "x" may be used to denote multiple elements. Here, "x" may be a number corresponding to $2^N$, e.g., 4, 8, 16, 64, or 256, but may be not limited thereto.

A first electrode of a second reset unit 380 may electrically connect to first signal storage units 325a, 325b . . . 325x of respective pixel units, and a second electrode of the second reset unit 380 may electrically connect to a fourth device voltage node 385. Further, the second reset unit 380 may reset the first signal storage units 325a, 325b . . . 325x of the respective pixel units in response to a reset signal applied to a gate electrode thereof from a control unit (not shown).

Next, layouts of the CMOS image sensors according to the various embodiments of the invention, and longitudinal sectional views of the CMOS image sensors on a semiconductor substrate, will be described.

Figure 5A:
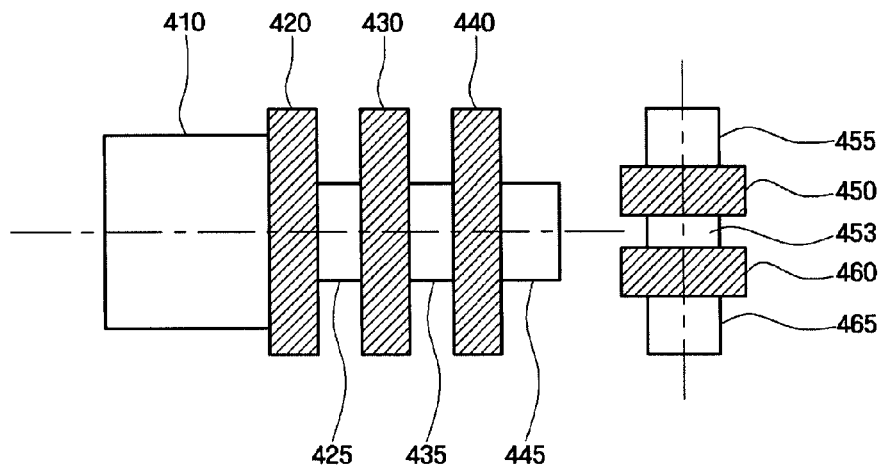
FIG. 5A illustrates a layout of a CMOS image sensor according to an embodiment of the invention.
Figure 5B:
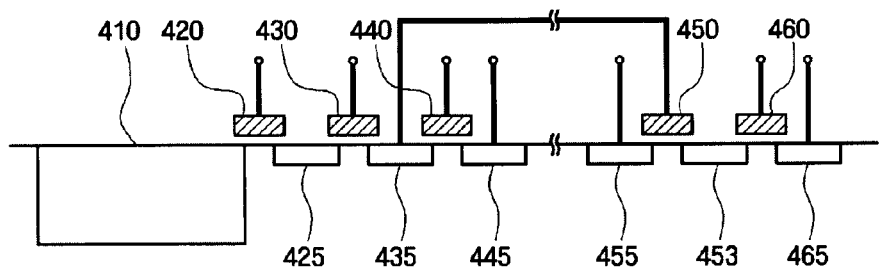
FIG. 5B illustrates a longitudinal sectional view of the CMOS image sensor illustrated in FIG. 5A on a semiconductor substrate according to an embodiment of the invention.

FIG. 5A illustrates a view of a layout of the CMOS image sensor according to one embodiment of the invention. FIG. 5B illustrates a longitudinal sectional view of the CMOS image sensor of FIG. 5A In FIG. 5A, the CMOS image sensor may include a first conductive region 410, a first conductive line 420, a second conductive region 425, a second conductive line 430, a third conductive region 435, and a third conductive line 440 which may be disposed to be sequentially adjacent to each other. A fourth conductive region 445, a fifth conductive region 455, a fourth conductive line 450, a sixth conductive region 453, a fifth conductive line 460, and a seventh conductive region 465 may be are disposed to be sequentially adjacent to each other.

The third conductive region 435 and the fourth conductive line 450 may be electrically connected to each other. The first conductive region 410 may generate electrical signals. The fourth conductive region 445 may be electrically connected to a device voltage node, the fifth conductive region 455 may be electrically connected to a device voltage node, and the seventh conductive region 465 may be electrically connected to an output unit. The first conductive line 420, the second conductive line 430, the third conductive line 440, and the fifth conductive line 460 may be respectively supplied with separate control signals.

FIG. 5B illustrates a longitudinal sectional view of the CMOS image sensor according to an embodiment of the invention.

In FIG. 5B, the CMOS image sensor may include the first conductive region 410, the second conductive region 425 spaced apart from the first conductive region 410, the third conductive region 435 spaced apart from the second conductive region 425, and the fourth conductive region 445 spaced apart from the third conductive region 435, which may be sequentially formed on the semiconductor substrate. The first conductive line 420 may be in a portion spaced apart between the first conductive region 410 and the second conductive region 425, the second conductive line 430 may be in a portion spaced apart between the second conductive region 425 and the third conductive region 435, and the third conductive line 440 that may be in a portion spaced apart between the third conductive region 435 and the fourth conductive region 445, which may be formed on the semiconductor substrate. The fifth conductive region 455, the sixth conductive region 453 spaced apart from the fifth conductive region 455, and the seventh conductive region 465 spaced apart from the sixth conductive region 453, may be sequentially formed on the semiconductor substrate. The fourth conductive line 450 in a portion spaced apart between the fifth conductive region 455 and the sixth conductive region 453, and the fifth conductive line 460 that in a portion spaced apart between the sixth conductive region 453 and the seventh conductive region 465, may be formed on the semiconductor substrate.

The third conductive region 435 and the fourth conductive line 450 may be electrically connected. The electrical connection may be by using, e.g., conductive polysilicon. The conductive polysilicon electrical connection may be advantageous in minimizing a leakage current. The first conductive region 410 may generate electrical signals.

The fourth conductive region 445 may be electrically connected to a first device voltage node, the fifth conductive region 455 may be electrically connected to a second device voltage node, and the seventh conductive region 465 may be electrically connected to an output unit.

Further, the first conductive line 420, the second conductive line 430, the third conductive line 440, and the fifth conductive line 460 may be respectively supplied with separate control signals.

Although not shown, an insulating layer may be interposed between a surface of the semiconductor substrate and the conductive lines 420, 430, 440, 450, and 460

In all of the conductive regions 410, 425, 435, 445, 453, 455, and 465, which are adjacent to each other, and all of the conductive lines 420, 430, 440, 450, and 460, which are adjacent to each other, adjacent boundary portions may partially overlap. Accordingly, in the drawing figures, the adjacent boundary portions thereof are shown to partially overlap each other. The overlap may not be restricted but may be adjusted in consideration of many variables. Therefore, a detailed explanation on the overlap is omitted.

The invention set forth in FIGS. 5A and 5B may be analogized to the circuit diagram set forth in FIG. 2A.

Figure 6A:
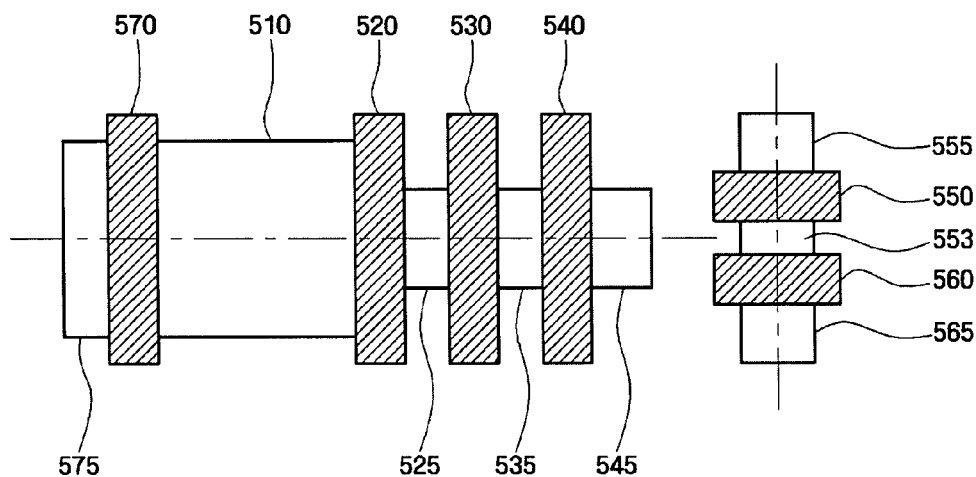
FIG. 6A illustrates a layout of a CMOS image sensor according to another embodiment of the invention.
Figure 6B:
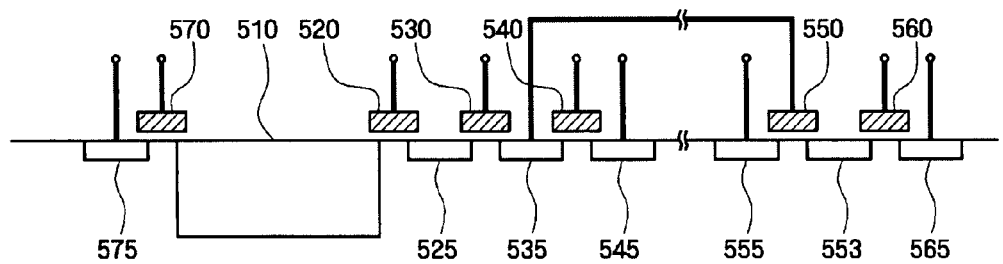
FIG. 6B illustrates a longitudinal sectional view of the CMOS image sensor illustrated in FIG. 6A on a semiconductor substrate according to another embodiment of the invention.

FIG. 6A illustrates a view of a layout of the CMOS image sensor according to another embodiment of the invention, and FIG. 6B illustrates a longitudinal sectional view of the CMOS image sensor of FIG. 6A.

In FIG. 6A, the CMOS image sensor may include an eighth conductive region 575, a sixth conductive line 570, a first conductive region 510, a first conductive line 520, a second conductive region 525, a second conductive line 530, a third conductive region 535, a third conductive line 540, and a fourth conductive region 545, which may be disposed to be sequentially adjacent. A fifth conductive region 555, a fourth conductive line 550, a sixth conductive region 553, a fifth conductive line 560, and a seventh conductive region 565 may also be disposed to be sequentially adjacent.

The third conductive region 535 and the fourth conductive line 550 may be electrically connected. The first conductive region 510 may generate electrical signals. The fourth conductive region 545 may be electrically connected to a first device voltage node, the fifth conductive region 555 may be electrically connected to a second device voltage node, and the seventh conductive region 565 may be electrically connected to an output unit.

The first conductive line 520, the second conductive line 530, the third conductive line 540, and the fifth conductive line 560 may be respectively supplied with separate control signals.

FIG. 6B illustrates a longitudinal sectional view of the CMOS image sensor of FIG. 6A.

In FIG. 6B, the CMOS image sensor may include the eighth conductive region 575, the first conductive region 510, the second conductive region 525 (that may be formed to be spaced apart from the first conductive region 510), the third conductive region 535 (that may be formed to be spaced apart from the second conductive region 525), and the fourth conductive region 545 (that may be formed to be spaced apart from the third conductive region 535), which may be sequentially formed on the semiconductor substrate. The sixth conductive line 570 may be formed in a portion spaced apart between the eighth conductive region 575 and the first conductive region 510, the first conductive line 520 may be formed in a portion spaced apart between the first conductive region 510 and the second conductive region 525, the second conductive line 530 may be formed in a portion spaced apart between the second conductive region 525 and the third conductive region 535, and the third conductive line 540 may be formed in a portion spaced apart between the third conductive region 535 and the fourth conductive region 545, which may be formed on the semiconductor substrate. The fifth conductive region 555 and the sixth conductive region 553 may be formed to be spaced apart from the fifth conductive region 555, and the seventh conductive region 565 may be formed to be spaced apart from the sixth conductive region 553, which may be sequentially formed on the semiconductor substrate. The fourth conductive line 550 may be formed in a portion spaced apart between the fifth conductive region 555 and the sixth conductive region 553, and the fifth conductive line 560 may be formed in a portion spaced apart between the sixth conductive region 553 and the seventh conductive region 565, which may be formed on the semiconductor substrate.

The third conductive region 535 and the fourth conductive line 550 may be electrically connected to each other. The first conductive region 510 may generate electrical signals. The fourth conductive region 545 may be electrically connected to a first device voltage node, the fifth conductive region 555 may be electrically connected to a second device voltage node, and the seventh conductive region 565 may be electrically connected to an output unit.

Further, the first conductive line 520, the second conductive line 530, the third conductive line 540, the fifth conductive line 560, and the sixth conductive line 570 may be respectively supplied with separate control signals.

In all the adjacent conductive regions 510, 525, 535, 545, 553, 555, 565, and 575, and all the adjacent conductive lines 520, 530, 540, 550, 560, and 570, adjacent boundary portions thereof may partially overlap. Accordingly, the adjacent boundary portions thereof are shown to partially overlap each other in the drawing figures. The overlap may not be specifically set but may be adjusted in consideration of one or of multiple variables.

Figure 7A:
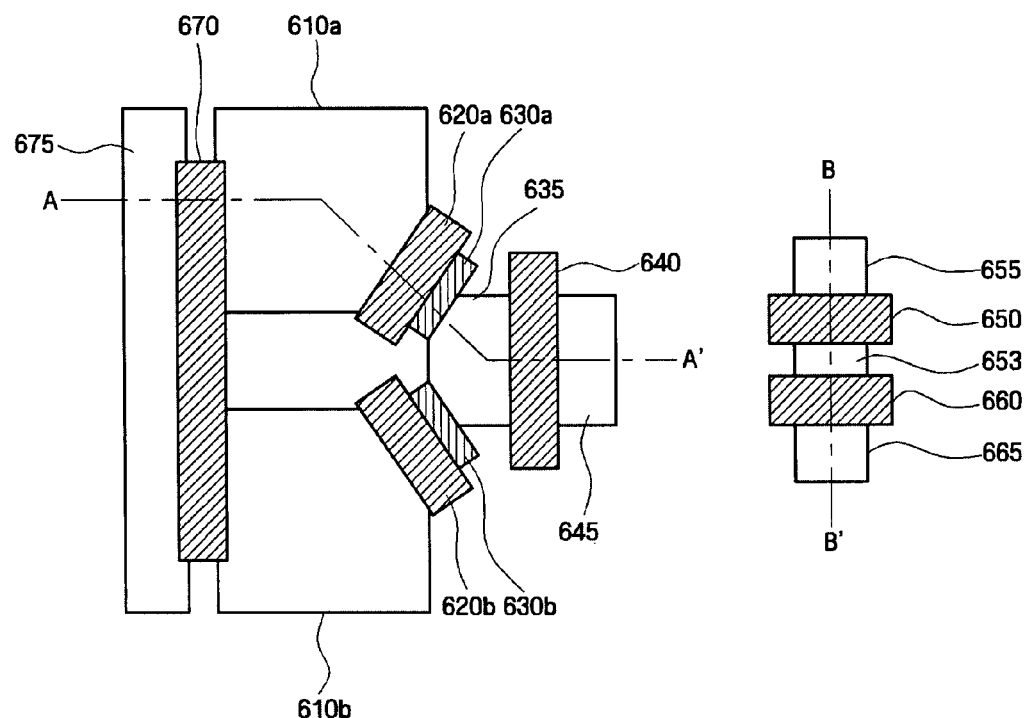
FIG. 7A illustrates a layout of the pixel array of the CMOS image sensor illustrated in FIG. 3B.
Figure 7B:
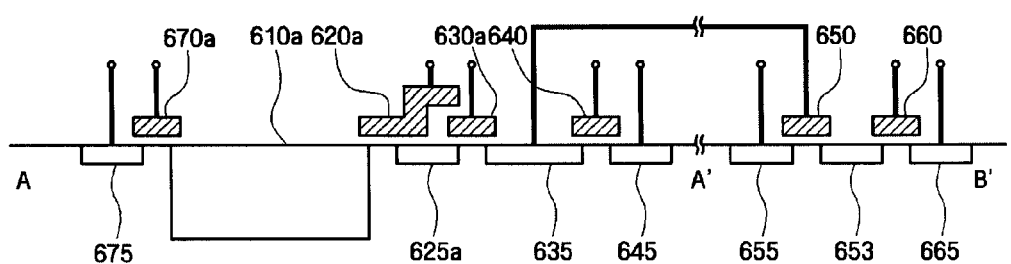
FIG. 7B illustrates a longitudinal sectional view of the pixel array of the CMOS image sensor illustrated in FIG. 3B.

FIG. 7A illustrates a layout of the pixel array of a CMOS image sensor according to an embodiment of the invention, which is diagrammed in FIG. 3B. FIG. 7B illustrates a longitudinal sectional view of the pixel array of the CMOS image sensor.

FIG. 7A shows a pixel array of the CMOS image sensor having a structural geometry that differs from the CMOS image sensor shown in FIG. 6A. In FIG. 7A, two pixel units A and B may share a third conductive region 635, a third conductive line 640, a fourth conductive region 645, a sixth conductive line 670, an eighth conductive region 675, a fifth conductive region 655, a fourth conductive line 650, a sixth conductive region 653, a fifth conductive line 660, and a seventh conductive region 665.

Furthermore, a first conductive line 620a and a second conductive line 630a of the first pixel unit A may overlap each other, i.e., not be the same size. Also, a first conductive line 620b and a second conductive line 630b of the second pixel unit B may overlap each other, i.e., not be the same size.

FIG. 7B illustrates a longitudinal sectional view of the CMOS image sensor shown in FIG. 7A.

Here, FIGS. 5B and 6B may be further referred to in addition to FIG. 7B. In FIG. 7B, the first conductive line 620a and the second conductive line 630a may be formed to partially overlap each other.

The first conductive line 620a and the second conductive line 630a may overlap each to reduce the area occupied by the pixels. Further, when the two conductive lines 620a and 630a overlap each other, an opposite-polarity voltage may be induced due to the mutual inductance effects. As a result, when one of the conductive lines 620a and 630a turns on, the other one may be in a turned-off state that may be more stable. Specifically, when an electrical signal is applied to the first conductive line 620a, and the first conductive line 620a may have positive (+) polarity, the second conductive line 630a may have negative (−) polarity. As a result, it may be possible to stably prevent a leakage current from generating between the second conductive region 625a and the third conductive region 635. In contrast, when an electrical signal is applied to the second conductive line 630a, and the second conductive line 630a may have positive (+) polarity, the first conductive line 620a may have negative (−) polarity. As a result, it may be possible to stably prevent a leakage current from generating between the first conductive region 610a and the second conductive region 625a. The same observations apply to the first conductive line 620b and a second conductive line 630b of the second pixel unit B.

FIGS. 8A to 8D illustrate layouts of the CMOS image sensors according to various embodiments of the invention. Specifically, in the layouts illustrated in FIGS. 8A to 8D, various conductive lines 720, 740, and 770 and various conductive regions 735, 745, and 775 may be shared.

FIG. 8A illustrates one possible configuration of the circuit diagrams and layouts of the CMOS image sensors shown in FIGS. 3A, 4A, 5A, and 6A, where multiple pixel units may share the third conductive line 740. For example, a first pixel unit may include a first conductive region 710a, a first conductive line 720a, a second conductive region 725a, a second conductive line 730a, a third conductive region 750a, a third conductive line 740a of conductive line 740, and a fourth conductive region 745 (which may or may not be shared). More specifically, the third conductive line 740 may be a gate line of a reset unit or a reset transistor. A second pixel region analogously may have a first conductive region 710, etc. However, a fourth conductive region (analogous to fourth conductive region 745) may be optional in the intermediate pixels typified by the second pixel. Finally, an nth pixel unit may include a first conductive region 710x, a first, conductive line 720x, a second conductive region 725x, a second conductive line 730x, a third conductive region 735, conductive line 740, and a fourth conductive region 745.

Figure 8B:
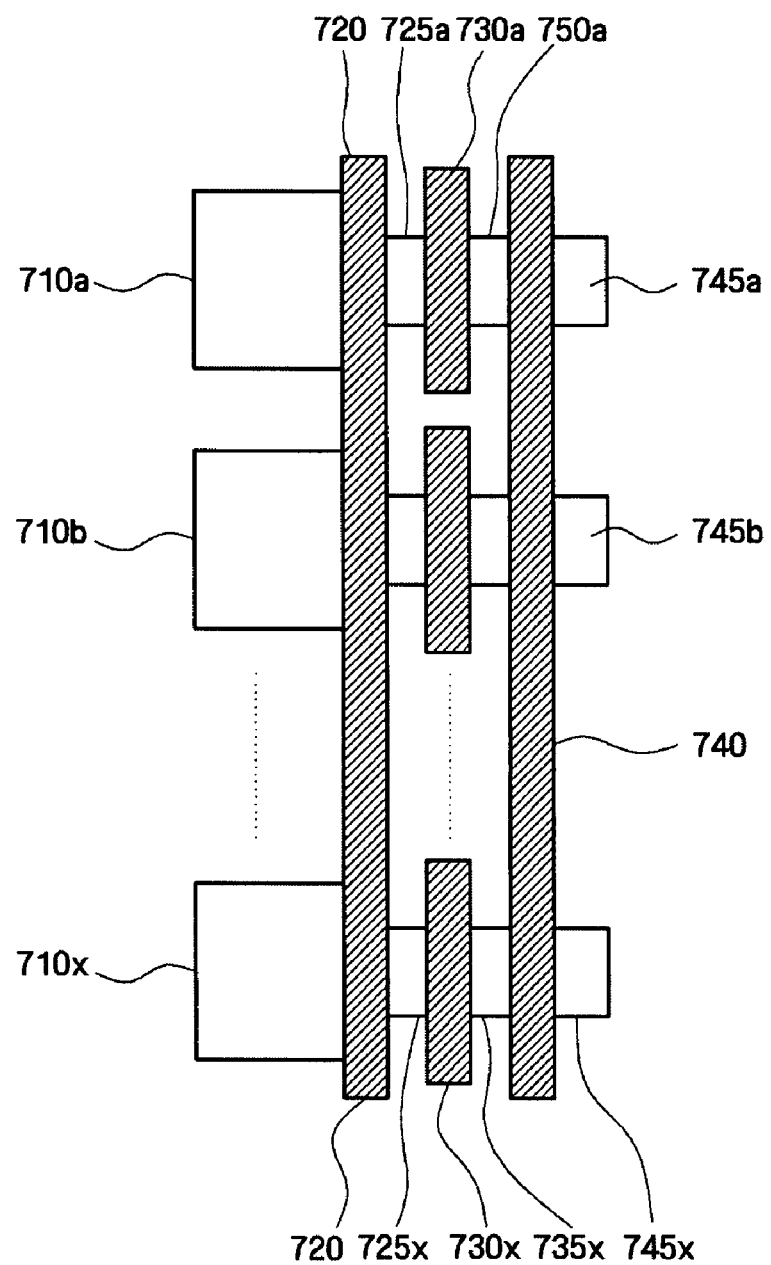

The circuit diagrams and layouts of the CMOS image sensors shown in FIGS. 3A, 4A, 5A, and 6A may be referred to in order to help elucidate the CMOS image sensor configuration illustrated in FIG. 8B. In FIG. 8B, multiple pixel units share the first conductive line 720 and the third conductive line 740. More specifically, the first conductive line 720 may be a gate line of a signal transmission unit or a transistor for signal transmission, and the third conductive line 740 may be a gate line of a reset unit or a reset transistor. In this configuration, a fourth conductive region may be present in the intervening pixels between the first and nth pixels.

Figure 8C:
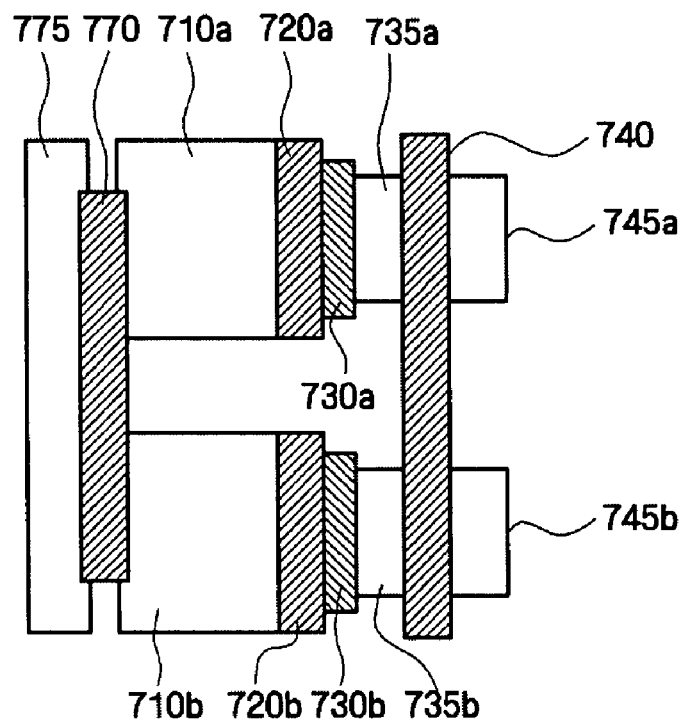

In FIG. 8C, the circuit diagrams and layouts of the CMOS image sensors shown in FIGS. 3B, 4B, 6B, 7A, and 8A may be referred to in order to better understand the technology. In FIG. 8C, multiple pixel units may share the eighth conductive region 775, the sixth conductive line 770, and the third conductive line 740. More specifically, the eighth conductive region 775 may be a device voltage node, the sixth conductive line 770 may be a discharge unit for discharging electrical signals or a gate line of an overflow transistor, and the third conductive line 740 may be a gate line of a reset unit or a reset transistor. The two illustrated pixel units include first conductive regions 710a, 710b, a first conductive lines 720a, 720b, second conductive lines 730a, 730b, second conductive regions 735a, 735b and fourth conductive regions 745a, 745b.

Figure 8D:
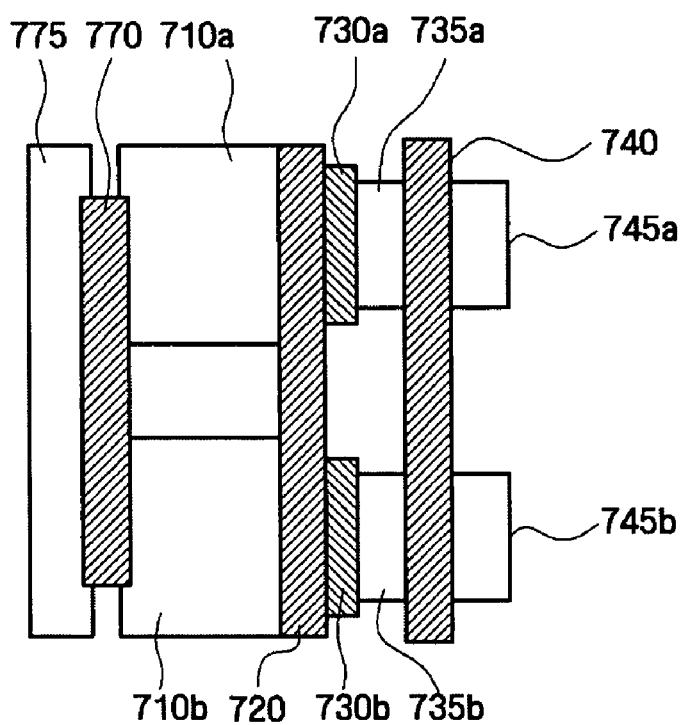

In FIG. 8D, the circuit diagrams and layouts of the CMOS image sensors shown in FIGS. 3B, 4B, 6B, 7A, and 8A may also be referred to in order to help understand the technology. In FIG. 8D, multiple pixel units share the eighth conductive region 775, the sixth conductive line 770, the first conductive line 720, and the third conductive line 740. More specifically, the eighth conductive region 775 may be a device voltage node, the sixth conductive line 770 may be a discharge unit for discharging electrical signals or a gate line of an overflow transistor, the first conductive line 720 may be a gate line of a signal transmission unit or a transistor for signal transmission, and the third conductive line 740 may be a gate line of a reset unit or a reset transistor.

Although not shown, in the layouts shown in FIGS. 8A to 8D, two pixel units may be disposed as a pair, as shown in FIG. 7A. For example, in the case when "x" is 4, two sets of paired pixel units may be disposed, or in the case when "x" is 8, four sets of paired pixel units may be disposed.

As described above, in the semiconductor devices and the CMOS image sensors according to the embodiments of the invention, it may be possible to perform a precise signal processing that may be free from distortion because electrical signals may be temporarily stored.

Exemplary embodiments of the invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A semiconductor device, comprising:
an electrical signal generation unit;
a first signal transmission unit electrically connected to the electrical signal generation unit;
a first signal storage unit electrically connected to the first signal transmission unit;
a second signal transmission unit electrically connected to the first signal storage unit;
a second signal storage unit electrically connected to the second signal transmission unit;
a reset unit electrically connected to the second signal storage unit;
an amplification unit electrically connected to the second signal storage unit;
a selection unit electrically connected to the amplification unit; and
an output unit electrically connected to the selection unit, wherein the selection unit comprises a transistor having a first electrode electrically connected to a first electrode of the amplification unit and a second electrode electrically connected to the output unit.

2. The semiconductor device as claimed in claim 1, wherein:
the first signal transmission unit comprises a transistor having a first electrode electrically connected to the electrical signal generation unit and a second electrode electrically connected to the first signal storage unit; and
the second signal transmission unit comprises a transistor having a first electrode electrically connected to the first signal storage unit and a second electrode electrically connected to the second signal storage unit.

3. The semiconductor device as claimed in claim 1, wherein:
the electrical signal generation unit comprises an optical charge generation unit; and
each of the first and second signal storage units comprises a conductive region formed by doping impurities into a substrate.

4. The semiconductor device as claimed in claim 1, wherein:
the reset unit comprises a transistor having a first electrode electrically connected to the second signal storage unit and a second electrode electrically connected to a device voltage node; and
the amplification unit comprises a transistor having a gate electrode electrically connected to the second signal transmission unit and source and drain electrodes, one of which is electrically connected to the device voltage node.

5. A semiconductor device comprising:
an electrical signal generation unit;
a first signal transmission unit electrically connected to the electrical signal generation unit;
a first signal storage unit electrically connected to the first signal transmission unit;
a second signal transmission unit electrically connected to the first signal storage unit;
a second signal storage unit electrically connected to the second signal transmission unit;
a reset unit electrically connected to the second signal storage unit;
an amplification unit electrically connected to the second signal storage unit;
a selection unit electrically connected to the amplification unit;
an output unit electrically connected to the selection unit; and
a discharge unit having a first electrode electrically connected to the electrical signal generation unit and a second electrode coupled to a device voltage node.

6. A CMOS image sensor, comprising:
a pixel array, wherein the pixel array comprises:
a first pixel unit having a first electrical signal generation unit, a first signal transmission unit electrically connected to the first signal generation unit, a first signal storage unit electrically connected to the first signal transmission unit, and a second signal transmission unit electrically connected to the first signal storage unit;

a second signal storage unit electrically connected to the second signal transmission unit;

a reset unit and an amplification unit electrically connected to the second signal storage unit;

a selection unit electrically connected to the amplification unit; and an output unit electrically connected to the selection unit, wherein the selection unit comprises a transistor having a first electrode electrically connected to a first electrode of the amplification unit and a second electrode electrically connected to the output unit.

7. The CMOS image sensor as claimed in claim 6, wherein:

the reset unit comprises a transistor having a first electrode electrically connected to the second signal storage unit and a second electrode electrically connected to a device voltage node; and the amplification unit comprises a transistor having a gate electrode electrically connected to the second signal storage unit, a first electrode electrically connected to a pixel voltage node, and a second electrode electrically connected to the selection unit.

8. A CMOS image sensor, comprising:

a pixel array, wherein the pixel array comprises:

a first pixel unit having a first electrical signal generation unit, a first signal transmission unit electrically connected to the first signal generation unit, a first signal storage unit electrically connected to the first signal transmission unit, and a second signal transmission unit electrically connected to the first signal storage unit;

a second signal storage unit electrically connected to the second signal transmission unit;

a reset unit and an amplification unit electrically connected to the second signal storage unit;

a selection unit electrically connected to the amplification unit;

an output unit electrically connected to the selection unit;

a second pixel unit comprising a second electrical signal generation unit;

a third signal transmission unit electrically connected to the second signal generation unit;

a third signal storage unit electrically connected to the third signal transmission unit; and a fourth signal transmission unit electrically connected to the second signal storage unit.

9. The CMOS image sensor as claimed in claim 8, wherein:

the first signal transmission unit comprises a first transistor having a first source electrode and a first drain electrode, one of the first source electrode and the first drain electrode being electrically connected to the first signal generation unit and the other of the first source electrode and the first drain electrode being electrically connected to the first signal storage unit;

the second signal transmission unit comprises a second transistor having a second source electrode and a second drain electrode, one of the second source electrode and the second drain electrode being electrically connected to the first signal storage unit and the other of the second source electrode and the second drain electrode being electrically connected to the second signal storage unit;

the third signal transmission unit comprises a third transistor having a third source electrode and a third drain electrode, one of the third source electrode and the third drain electrode being electrically connected to the second signal generation unit and the other of the third source electrode and the third drain electrode being electrically connected to the second signal storage unit; and the fourth signal transmission unit comprises a fourth transistor having a fourth source electrode and a fourth drain electrode, one of the fourth source electrode and the fourth drain electrode being electrically connected to the third signal storage unit and the other of the fourth source electrode and the fourth drain electrode being electrically connected to the second signal storage unit.

10. The CMOS image sensor as claimed in claim 8, wherein the pixel array further comprises:

a first overflow transistor having a first electrode electrically connected to the first signal generation unit and a second electrode connected to a device voltage node; and a second overflow transistor having a first electrode electrically connected to the second signal generation unit and a second electrode connected to the device voltage node.

11. A CMOS image sensor, comprising:

an optical charge generation unit formed within a substrate;

a first transistor on the substrate, the first transistor being adjacent to the optical charge generation unit;

a first signal storage unit within the substrate, the first signal storage unit being adjacent to the first transistor;

a second transistor on the substrate, the second transistor being adjacent to the first signal storage unit;

a second signal storage unit within the substrate, the second signal storage unit being adjacent to the second transistor;

a reset transistor on the substrate, the reset transistor being electrically connected to the second signal storage unit; and a third transistor on the substrate adjacent to the optical charge generation unit, wherein the third transistor comprises a source electrode and a drain electrode, one of which is connected to a device voltage node.

12. The CMOS image sensor as claimed in claim 11, wherein the first transistor is on the second transistor such that the first transistor partially overlaps the second transistor.

13. A CMOS image sensor, comprising:

an optical charge generation unit formed within a substrate;

a first transistor on the substrate, the first transistor being adjacent to the optical charge generation unit;

a first signal storage unit within the substrate, the first signal storage unit being adjacent to the first transistor;

a second transistor on the substrate, the second transistor being adjacent to the first signal storage unit;

a second signal storage unit within the substrate, the second signal storage unit being adjacent to the second transistor;

a reset transistor on the substrate, the reset transistor being electrically connected to the second signal storage unit;

an amplifying transistor on the substrate, the amplifying transistor being electrically connected to the second signal storage unit;

a selection transistor electrically connected to the amplifying transistor; and an output transistor electrically connected to the selection transistor;

wherein the second signal storage unit and the amplifying transistor are electrically connected with polysilicon.

14. The CMOS image sensor as claimed in claim 13, further comprising a device voltage node electrically connected to at least one of the reset transistor or the amplifying transistor, wherein the second signal storage unit is electrically connected to a gate electrode of the amplifying transistor.

15. A The CMOS image sensor, comprising:
   a first signal generation unit;
   a first signal transmission unit adjacent to the first signal generation unit;
   a second signal transmission unit partially overlapping the first signal transmission unit;
   a signal storage unit adjacent to the second signal transmission unit;
   a reset unit adjacent to the signal storage unit;
   a second signal generation unit;
   a third signal transmission unit adjacent to the second signal generation unit; and
   a fourth signal transmission unit partially overlapping the third signal transmission unit,
   wherein the fourth signal transmission unit is adjacent to the signal storage unit.

16. The CMOS image sensor as claimed in claim 15, further comprising a fifth signal transmission unit adjacent to the first signal transmission unit and the second signal transmission unit.

17. The CMOS image sensor as claimed in claim 15, further comprising:
   an amplification unit; and
   a selection unit.

* * * * *